United States Patent
Yoshida

(10) Patent No.: US 11,020,776 B2
(45) Date of Patent: Jun. 1, 2021

(54) SUBSTRATE CLEANING METHOD AND SUBSTRATE CLEANING APPARATUS

(71) Applicant: SCREEN Holdings Co., Ltd., Kyoto (JP)

(72) Inventor: Yukifumi Yoshida, Kyoto (JP)

(73) Assignee: SCREEN Holdings Co., Ltd.

( * ) Notice: Subject to any disclaimer, the term of this patent is extended or adjusted under 35 U.S.C. 154(b) by 43 days.

(21) Appl. No.: 16/102,790

(22) Filed: Aug. 14, 2018

(65) Prior Publication Data

US 2019/0091737 A1 Mar. 28, 2019

(30) Foreign Application Priority Data

Sep. 22, 2017 (JP) .............................. JP2017-182550
Dec. 4, 2017 (JP) .............................. JP2017-232847

(51) Int. Cl.
*H01L 21/02* (2006.01)
*B08B 7/00* (2006.01)
(Continued)

(52) U.S. Cl.
CPC .............. *B08B 7/0014* (2013.01); *B08B 3/08* (2013.01); *B08B 3/10* (2013.01);
(Continued)

(58) Field of Classification Search
CPC .......... B08B 3/08; B08B 3/10; B08B 7/0014; B08B 2203/007; C11D 11/0047;
(Continued)

(56) References Cited

U.S. PATENT DOCUMENTS

2011/0230054 A1* 9/2011 Tomita ............... H01L 21/02052
438/758
2014/0041685 A1 2/2014 Kaneko et al.
(Continued)

FOREIGN PATENT DOCUMENTS

JP 2013-016599 A 1/2013
JP 2014-140085 7/2014
(Continued)

OTHER PUBLICATIONS

Joan Tomsic, Dictionary of Materials and Testing, "volatile" at 428 (2d ed. SAE Int'l 2000). (Year: 2000).*
(Continued)

*Primary Examiner* — Mikhail Kornakov
*Assistant Examiner* — Richard Z. Zhang
(74) *Attorney, Agent, or Firm* — Ostrolenk Faber LLP

(57) ABSTRACT

A substrate cleaning method includes a processing liquid supplying step which supplies a processing liquid that contains a solute and a volatile solvent to an upper surface of a substrate, a film forming step in which the solvent is at least partially volatilized from the processing liquid and solidified or hardened to form a particle holding layer on the upper surface of the substrate, and a removal step in which a peeling liquid is supplied to the upper surface of the substrate to peel and remove the particle holding layer. A solute composition in the solute is insoluble in the peeling liquid before being heated to a temperature equal/higher than a quality-changing temperature to become soluble in the peeling liquid. During film forming, the processing liquid is heated to a temperature below the quality-changing temperature, to form the particle holding layer, without changing the quality of the solute composition. A residue removal step that removes a residue removing liquid which dissolves before being heated to a temperature equal/higher (Continued)

than the quality-changing temperature is supplied to the upper surface of the substrate, to remove residues that remain.

7 Claims, 17 Drawing Sheets

(51) Int. Cl.
  *B08B 3/08* (2006.01)
  *B08B 3/10* (2006.01)
  *H01L 21/67* (2006.01)
  *H01L 21/687* (2006.01)

(52) U.S. Cl.
  CPC .. *H01L 21/02052* (2013.01); *H01L 21/02057* (2013.01); *H01L 21/67017* (2013.01); *H01L 21/67028* (2013.01); *H01L 21/67051* (2013.01); *H01L 21/67103* (2013.01); *H01L 21/67109* (2013.01); *H01L 21/67248* (2013.01); *H01L 21/6875* (2013.01); *B08B 2203/007* (2013.01)

(58) Field of Classification Search
  CPC ......... H01L 21/02041; H01L 21/02052; H01L 21/02057; H01L 21/0206; H01L 21/67017; H01L 21/67028; H01L 21/67051; H01L 21/67103; H01L 21/6715; H01L 21/67248; C03C 25/282
  See application file for complete search history.

(56) References Cited

U.S. PATENT DOCUMENTS

| | | | |
|---|---|---|---|
| 2014/0144465 A1* | 5/2014 | Kaneko | H01L 21/67051 134/4 |
| 2015/0064910 A1* | 3/2015 | Kaneko | B05B 7/00 438/694 |
| 2015/0064911 A1* | 3/2015 | Kaneko | H01L 21/6715 438/694 |
| 2015/0128994 A1* | 5/2015 | Kaneko | H01L 21/0206 134/4 |
| 2015/0128995 A1* | 5/2015 | Kaneko | C11D 11/0047 134/4 |
| 2016/0035561 A1 | 2/2016 | Aibara et al. | |
| 2018/0211828 A1 | 7/2018 | Chung et al. | |

FOREIGN PATENT DOCUMENTS

| | | |
|---|---|---|
| JP | 2014-197717 A | 10/2014 |
| JP | 2016-036012 A | 3/2016 |
| JP | 2018-110220 A | 7/2018 |
| KR | 10-2017-0075770 | 7/2017 |
| TW | 201531807 A | 8/2015 |
| WO | WO 2017/056746 A1 | 4/2017 |

OTHER PUBLICATIONS

George Wypych, Knovel Solvents—A Properties Database, entries for "water" and "propylene glycol monoethyl ether" (ChemTec Publishing 2008). (Year: 2008).*

Yaws' Handbook of Properties for Aqueous Systems (2012 Knovel). (Year: 2012).*

Yaws' Thermophysical Properties of Chemicals and Hydrocarbons (2010 Knovel). (Year: 2010).*

* cited by examiner

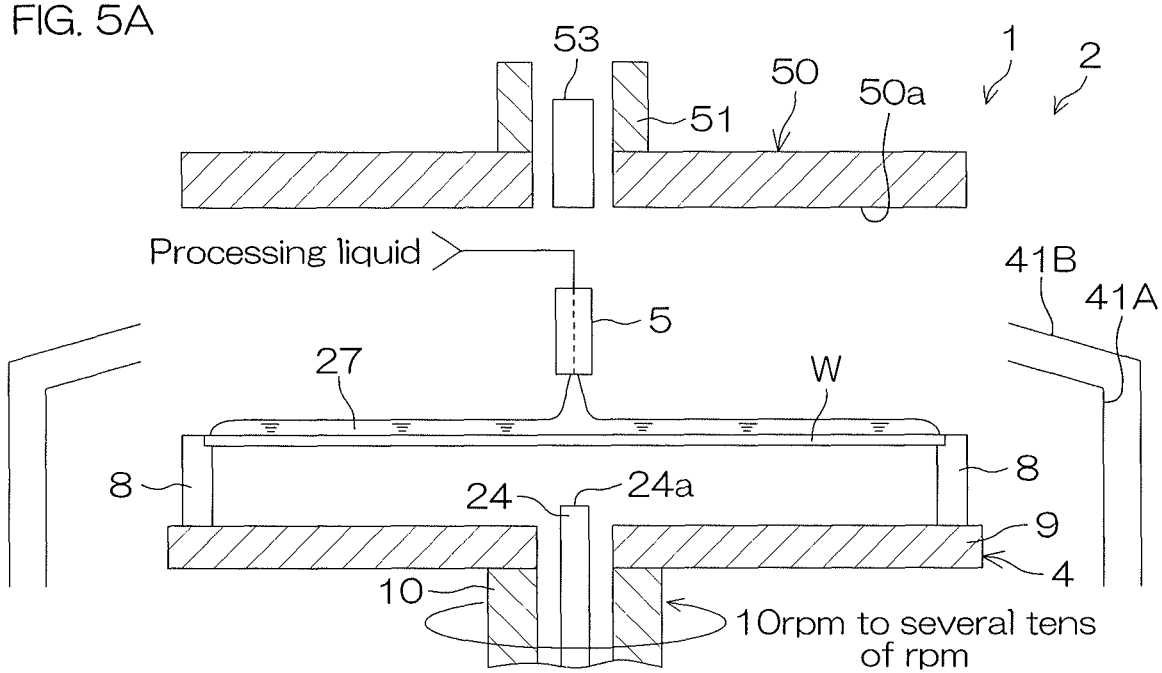
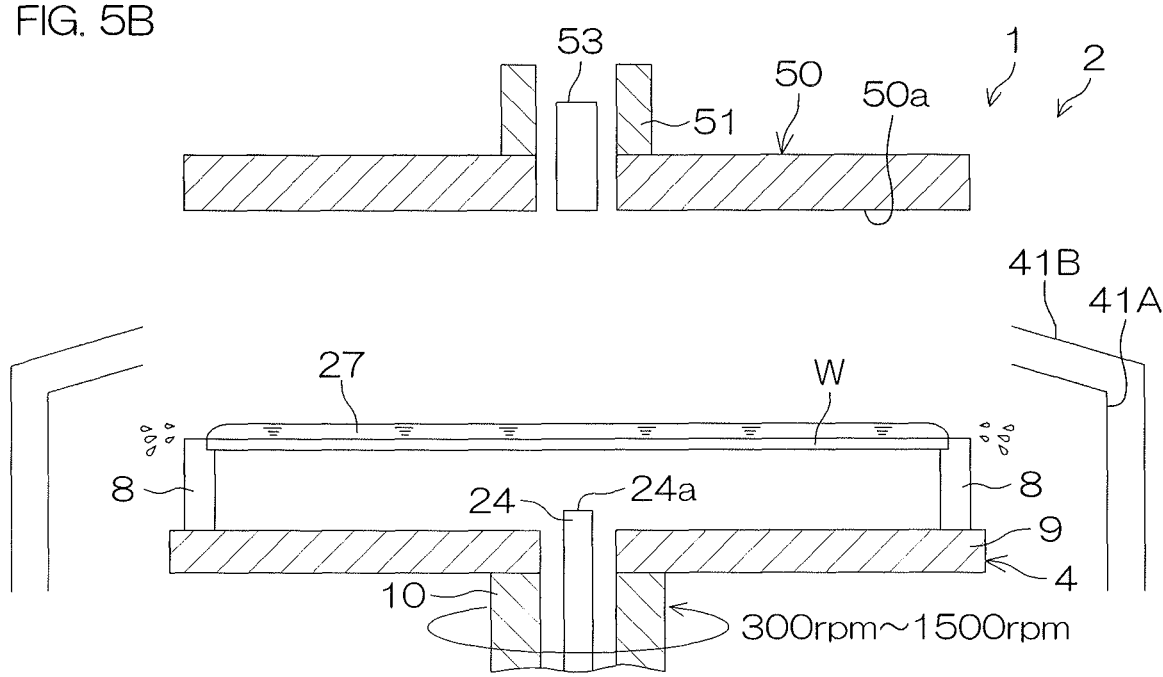

FIG. 9

SUBSTRATE CLEANING METHOD AND SUBSTRATE CLEANING APPARATUS

BACKGROUND OF THE INVENTION

1. Field of the Invention

The present invention relates to a substrate cleaning method and a substrate cleaning apparatus. Examples of substrates to be processed include semiconductor wafers, substrates for liquid crystal displays, substrates for FEDs (Flat Panel Displays) such as organic electroluminescence displays, substrates for optical disks, substrates for magnetic disks, substrates for magneto-optical disks, substrates for photomasks, ceramic substrates and substrates for solar batteries.

2. Description of the Related Art

In a manufacturing process of semiconductor devices, there is executed a cleaning step for removing various types of contaminants attached to a substrate, residues of a processing liquid, a resist, etc., used in a previous step, or various types of particles (hereinafter, collectively referred to as "particles" from time to time).

In the cleaning step, it is generally conducted that a cleaning liquid such as deionized water (DIW) is supplied to a substrate to physically remove particles or a chemical liquid which chemically reacts with particles is supplied to a substrate to chemically remove the particles.

However, patterns which are formed on a substrate have been made finer and more complicated. It is, therefore, becoming less easy to remove particles physically or chemically.

A method has been, thus, proposed in which a processing liquid that contains a solute and a volatile solvent is supplied to an upper surface of a substrate to form a film by solidifying or hardening the processing liquid (hereinafter, referred to as "particle holding layer") and, thereafter, the particle holding layer is dissolved and removed (Japanese Patent Application Publication No. 2014-197717 and United States Patent Application Publication No. 2015/128994).

According to the above-described method, particles are separated from the substrate when the processing liquid is solidified or hardened to form the particle holding layer. The separated particles are then held in the particle holding layer.

Next, a dissolution processing liquid is supplied to an upper surface of a substrate. Thereby, the particle holding layer is dissolved on the substrate and removed and particles are, therefore, removed from the upper surface of the substrate together with the particle holding layer (refer to Japanese Patent Application Publication No. 2014-197717).

There is also a case where a peeling processing liquid is supplied to an upper surface of a substrate. Thereby, the particle holding layer is peeled from the upper surface of the substrate. Next, the dissolution processing liquid is supplied to dissolve the particle holding layer on the substrate (refer to United States Patent Application Publication No. 2015/128994).

SUMMARY OF THE INVENTION

However, according to the methods described in both Japanese Patent Application Publication No. 2014-197717 and United States Patent Application Publication No. 2015/128994, since the particle holding layer is dissolved on a substrate, particles will drop from the particle holding layer which is being dissolved, thus resulting in a possibility that the layer may be attached again to the substrate. Therefore, the particle removal efficiency does not become higher as expected.

Thus, the inventor of the present application has evaluated a method in which a particle holding layer which has been peeled is not dissolved but removed from an upper surface of a substrate. Specifically, the particle holding layer is peeled from the upper surface of the substrate and, thereafter, for example, a rinse liquid is supplied to the upper surface of the substrate to clean the upper surface of the substrate.

However, in this case, it has been found that fine residues due to the particle holding layer are not peeled from the upper surface of the substrate but may remain on the upper surface of the substrate or the peeled residues may be attached again to the upper surface of the substrate.

Thus, an object of the present invention is to provide a substrate cleaning method and a substrate cleaning apparatus which are capable of not only removing particles from an upper surface of a substrate at a high removal efficiency but also suppressing residues of a particle holding layer from remaining on the upper surface of the substrate or being attached again thereto.

In order to attain the above-described object, the present invention provides a first substrate cleaning method which includes a processing liquid supplying step of supplying a processing liquid that includes a solute and a solvent, which has volatility, to an upper surface of a substrate, a film forming step in which the solvent is at least partially volatilized from the processing liquid supplied to the upper surface of the substrate, by which the processing liquid is solidified or hardened to form a particle holding layer on the upper surface of the substrate, a removal step in which a peeling liquid, which peels the particle holding layer, is supplied to the upper surface of the substrate to peel and remove the particle holding layer from the upper surface of the substrate, and a residue removal step.

In this method, a solute composition which is the solute included in the particle holding layer has such properties that the solute composition is hardly soluble or insoluble in the peeling liquid before being heated at a temperature equal to or higher than a quality-changing temperature and the solute composition is also changed in quality by being heated at a temperature equal to or higher than the quality-changing temperature and becomes soluble in the peeling liquid. The film forming step includes a heating step in which the processing liquid supplied to the upper surface of the substrate is heated at a temperature less than the quality-changing temperature, thereby forming the particle holding layer on the upper surface of the substrate, with no change in quality of the solute composition. The residue removal step is such that a residue removing liquid which has the property of dissolving the solute composition before being heated at a temperature equal to or higher than the quality-changing temperature is supplied to the upper surface of the substrate after the removal step, thereby removing residues that remain on the upper surface of the substrate after the particle holding layer has been removed.

According to this method, in the film forming step which includes the heating step, the processing liquid is solidified or hardened. Thereby, the particle holding layer, which is hardly soluble or insoluble in the peeling liquid but can be peeled by the peeling liquid, is formed on the upper surface of the substrate.

When the processing liquid is solidified or hardened, particles are separated from the substrate. The separated particles are held in the particle holding layer. Therefore, in the removal step, the peeling liquid is supplied to the upper surface of the substrate, by which the particle holding layer which has been formed on the upper surface of the substrate can be peeled and removed from the upper surface of the substrate together with the particles held in the particle holding layer, without being dissolved by the peeling liquid.

Further, in the subsequent residue removal step, the residue removing liquid which has the property of dissolving the solute composition, that forms the particle holding layer, is supplied to the upper surface of the substrate after the particle holding layer has been removed. It is, thereby, possible to dissolve residues of the particle holding layer and remove them from the upper surface of the substrate.

Therefore, according to this method, the particle holding layer can be peeled from the upper surface of the substrate together with particles held therein to remove the particles at a high removal efficiency. It is also possible to suppress residues of the particle holding layer from remaining on the upper surface of the substrate or being attached again thereto.

According to one preferred embodiment of the present invention, in the heating step, a heating medium having a boiling point of less than the quality-changing temperature is supplied to a rear surface, that is a lower surface of the substrate, to heat the processing liquid supplied to the upper surface of the substrate at a temperature less than the quality-changing temperature.

According to this method, it is possible to execute the heating step included in the film forming step by a simple heating means which supplies a heating medium to the rear surface of the substrate.

Therefore, there is eliminated a necessity for providing, for example, an electric heater, etc., inside a chamber or executing a heating step in which the substrate is transferred to another chamber having an electric heater, etc. That is, it is possible to simplify a step of the substrate cleaning method.

In a preferred embodiment of the present invention, a temperature of the processing liquid on the substrate which is heated in the heating step is less than a boiling point of the solvent.

According to this method, the solvent is allowed to remain in the particle holding layer after being heated in the heating step included in the film forming step. Therefore, in the subsequent removal step, it is possible to easily peel the particle holding layer from the upper surface of the substrate by interactions between the solvent remaining in the particle holding layer and the supplied peeling liquid. In other words, the peeling liquid is permeated into the particle holding layer and brought to an interface with the substrate, by which the particle holding layer can be peeled by being floated from the upper surface of the substrate.

In order to further improve this effect, the peeling liquid is preferably compatible with the solvent.

The present invention also provides a second substrate cleaning method which includes a processing liquid supplying step of supplying a processing liquid that includes a solute and a solvent, which has volatility, to an upper surface of a substrate, a film forming step in which the solvent is at least partially volatilized from the processing liquid supplied to the upper surface of the substrate, by which the processing liquid is solidified or hardened to form a particle holding layer on the upper surface of the substrate, a removal step in which a peeling liquid, which peels the particle holding layer, is supplied to the upper surface of the substrate, thereby peeling and removing the particle holding layer from the upper surface of the substrate, and a residue removal step. Further, the film forming step includes a heating step in which a heating medium is supplied to a rear surface, that is a lower surface of the substrate, to heat the processing liquid supplied to the upper surface of the substrate at a temperature less than a boiling point of the heating medium, thereby forming the particle holding layer on the upper surface of the substrate. Further, the residue removal step is that a residue removing liquid, which has the property of dissolving a solute composition which is the solute included in the particle holding layer, is supplied to the upper surface of the substrate after the removal step, thereby removing residues that remain on the upper surface of the substrate after the particle holding layer has been removed.

According to this method, in the film forming step which includes the heating step, the processing liquid is solidified or hardened. Thereby, the particle holding layer, which can be peeled by the peeling liquid, is formed on the upper surface of the substrate.

When the processing liquid is solidified or hardened, particles are separated from the substrate. The separated particles are held in the particle holding layer. Therefore, in the removal step, the peeling liquid is supplied to the upper surface of the substrate, by which the particle holding layer formed on the upper surface of the substrate can be peeled and removed from the upper surface of the substrate together with the particles held in the particle holding layer.

Further, in the subsequent residue removal step, the residue removing liquid, which has the property of dissolving the solute composition that forms the particle holding layer, is supplied to the upper surface of the substrate after the particle holding layer has been removed. It is, thereby, possible to dissolve residues of the particle holding layer and remove the residues of the particle holding layer from the upper surface of the substrate.

Therefore, according to this method, the particle holding layer is peeled from the upper surface of the substrate together with the particles held therein, thus making it possible to remove the particles at a high removal efficiency. It is also possible to suppress residues of the particle holding layer from remaining on the upper surface of the substrate or being attached again thereto.

Moreover, according to this method, it is possible to execute the heating step included in the film forming step by a simple heating means which supplies a heating medium to the rear surface of the substrate.

Therefore, there is eliminated a necessity for providing, for example, an electric heater, etc., inside a chamber or executing a heating step in which the substrate is transferred to another chamber having an electric heater, etc. That is, it is also possible to simplify a step of the substrate cleaning method.

In a preferred embodiment of the present invention, a temperature of the processing liquid on the substrate which is heated in the heating step is less than a boiling point of the solvent.

According to the above-described method, the solvent is allowed to remain in the particle holding layer after being heated in the heating step included in the film forming step. Therefore, in the subsequent removal step, it is possible to easily peel the particle holding layer from the upper surface of the substrate by interactions between the solvent remaining in the particle holding layer and the supplied peeling liquid. In other words, the peeling liquid is permeated into the particle holding layer and the peeling liquid is brought to an interface between the particle holding layer and the substrate, by which the particle holding layer is peeled by being floated from the upper surface of the substrate.

In order to further improve the above-described effect, the peeling liquid is preferably compatible with the solvent.

The present invention also provides a third substrate cleaning method which includes a processing liquid supplying step of supplying a processing liquid that includes a solute and a solvent, which has volatility, to an upper surface of a substrate, a film forming step in which the solvent is at least partially volatilized from the processing liquid supplied to the upper surface of the substrate, by which the processing liquid is solidified or hardened to form a particle holding layer on the upper surface of the substrate, a removal step in which a peeling liquid, which peels the particle holding layer, is supplied to the upper surface of the substrate to peel and remove the particle holding layer from the upper surface of the substrate, and a residue removal step. Moreover, the film forming step includes a heating step in which the processing liquid supplied to the upper surface of the substrate is heated at a temperature less than a boiling point of the solvent, thereby forming the particle holding layer on the upper surface of the substrate. Moreover, the residue removal step is that a residue removing liquid which has the property of dissolving a solute composition that is the solute included in the particle holding layer is supplied to the upper surface of the substrate after the removal step, thereby removing residues that remain on the upper surface of the substrate after the particle holding layer has been removed.

According to this method, in the film forming step which includes the heating step, the processing liquid is solidified or hardened. Thereby, the particle holding layer which can be peeled by the peeling liquid is formed on the upper surface of the substrate.

When the processing liquid is solidified or hardened, particles are separated from the substrate. The separated particles are held in the particle holding layer. Therefore, the peeling liquid is supplied to the upper surface of the substrate in the removal step, by which the particle holding layer formed on the upper surface of the substrate can be peeled and removed from the upper surface of the substrate, together with particles held in the particle holding layer.

Moreover, in the subsequent residue removal step, the residue removing liquid, which has the property of dissolving the solute composition that forms the particle holding layer, is supplied to the upper surface of the substrate after the particle holding layer has been removed. It is, thereby, possible to dissolve residues of the particle holding layer and remove the residues of the particle holding layer from the upper surface of the substrate.

Therefore, according to the above-described method, the particle holding layer is peeled from the upper surface of the substrate together with particles held therein, thus making it possible to remove the particles at a high removal efficiency. It is also possible to suppress residues of the particle holding layer from remaining on the upper surface of the substrate or being attached again thereto.

Moreover, according to this method, the solvent is allowed to remain in the particle holding layer after being heated in the heating step included in the film forming step. Therefore, it is possible to easily peel the particle holding layer from the upper surface of the substrate in the subsequent removal step by interactions between the solvent remaining in the particle holding layer and the supplied peeling liquid. In other words, the peeling liquid is permeated into the particle holding layer and brought to an interface with the substrate, by which the particle holding layer can be peeled by being floated from the upper surface of the substrate.

In order to further improve this effect, the peeling liquid is preferably compatible with the solvent.

The present invention also provides a first substrate cleaning apparatus which includes a processing liquid supplying unit which supplies a processing liquid that includes a solute and a solvent, which has volatility, to an upper surface of a substrate, a heating unit in which the substrate is heated to volatilize at least partially the solvent, by which the processing liquid is solidified or hardened to form a particle holding layer on the upper surface of the substrate, a peeling liquid supplying unit which supplies a peeling liquid, which peels the particle holding layer, to the upper surface of the substrate, a residue removing liquid supplying unit which supplies to the upper surface of the substrate a residue removing liquid which removes residues that remain on the upper surface of the substrate after the particle holding layer has been peeled and removed, and a controller which controls the processing liquid supplying unit, the heating unit, the peeling liquid supplying unit and the residue removing liquid supplying unit. A solute composition that is the solute included in the particle holding layer has such properties that the solute composition is hardly soluble or insoluble in the peeling liquid before being heated at a temperature equal to or higher than a quality-changing temperature and the solute composition is also changed in quality by being heated at a temperature equal to or higher than the quality-changing temperature and becomes soluble in the peeling liquid. The residue removing liquid has the property of dissolving the solute composition before being heated at a temperature equal to or higher than the quality-changing temperature. The controller is programmed so as to execute a processing liquid supplying step of supplying the processing liquid to the upper surface of the substrate, a film forming step in which the solvent is at least partially volatilized from the processing liquid supplied to the upper surface of the substrate and the processing liquid is heated at a temperature less than the quality-changing temperature, thereby forming the particle holding layer on the upper surface of the substrate, with no change in quality of the solute composition, a removal step in which the peeling liquid is supplied to the upper surface of the substrate to peel and remove the particle holding layer from the upper surface of the substrate, and a residue removal step in which the residue removing liquid is supplied to the upper surface of the substrate, thereby removing residues that remain on the upper surface of the substrate after the particle holding layer has been removed.

According to this configuration, the processing liquid is solidified or hardened in the film forming step which includes the heating step. Thereby, the particle holding layer which is hardly soluble or insoluble in the peeling liquid but can be peeled by the peeling liquid is formed on the upper surface of the substrate.

When the processing liquid is solidified or hardened, particles are separated from the substrate. The separated particles are held in the particle holding layer. Therefore, the peeling liquid is supplied to the upper surface of the substrate in the removal step, by which the particle holding layer formed on the upper surface of the substrate is not dissolved by the peeling liquid but can be peeled and removed from the upper surface of the substrate together with particles held in the particle holding layer.

Further, in the subsequent residue removal step, a residue removing liquid, which has the property of dissolving the solute composition that forms the particle holding layer, is supplied to the upper surface of the substrate after the particle holding layer has been removed. It is, thereby, possible to dissolve residues of the particle holding layer and remove the residues of the particle holding layer from the upper surface of the substrate.

Therefore, according to this configuration, the particle holding layer is peeled from the upper surface of the substrate together with particles held therein, thus making it possible to remove the particles at a high removal efficiency. It is also possible to suppress residues of the particle holding layer from remaining on the upper surface of the substrate or being attached again thereto.

In a preferred embodiment of the present invention, the heating unit includes a heating medium supplying unit which supplies a heating medium having a boiling point of less than the quality-changing temperature to the lower surface of the substrate.

According to this configuration, it is possible to execute the heating step included in the film forming step by a simple heating means (heating medium supplying unit) which supplies a heating medium to the lower surface of the substrate.

Therefore, there is eliminated a necessity for providing, for example, an electric heater, etc., inside a chamber or executing a heating step by transferring a substrate to another chamber having an electric heater, etc. That is, it is possible to simplify a configuration of the substrate cleaning apparatus.

The present invention also provides a second substrate cleaning apparatus which includes a processing liquid supplying unit which supplies a processing liquid that includes a solute and a solvent, which has volatility, to an upper surface of a substrate, a heating unit which includes a heating medium supplying unit that supplies a heating medium to a lower surface of the substrate and in which the substrate is heated by the heating medium supplied from the heating medium supplying unit to volatilize at least partially the solvent, by which the processing liquid is solidified or hardened to forma particle holding layer on the upper surface of the substrate, a peeling liquid supplying unit which supplies a peeling liquid, which peels the particle holding layer, to the upper surface of the substrate, a residue removing liquid supplying unit which supplies to the upper surface of the substrate a residue removing liquid which removes residues that remain on the upper surface of the substrate after the particle holding layer has been peeled and removed, and a controller which controls the processing liquid supplying unit, the heating unit, the peeling liquid supplying unit and the residue removing liquid supplying unit. The residue removing liquid has the property of dissolving a solute composition that is the solute included in the particle holding layer. The controller is programmed so as to execute a processing liquid supplying step of supplying the processing liquid to the upper surface of the substrate, a film forming step in which the solvent is at least partially volatilized from the processing liquid supplied to the upper surface of the substrate and the processing liquid is heated at a temperature less than a boiling point of the heating medium, thereby forming the particle holding layer on the upper surface of the substrate, a removal step in which the peeling liquid is supplied to the upper surface of the substrate, thereby peeling the particle holding layer from the upper surface of the substrate, and a residue removal step in which the residue removing liquid is supplied to the upper surface of the substrate, thereby removing residues that remain on the upper surface of the substrate after the particle holding layer has been removed.

According to this configuration, the processing liquid is solidified or hardened in the film forming step which includes the heating step, thereby forming the particle holding layer which can be peeled by the peeling liquid on the upper surface of the substrate.

When the processing liquid is solidified or hardened, particles are separated from the substrate. The separated particles are held in the particle holding layer. Therefore, the peeling liquid is supplied to the upper surface of the substrate in the removal step, by which the particle holding layer formed on the upper surface of the substrate can be peeled and removed from the upper surface of the substrate, together with particles held in the particle holding layer.

Further, in the subsequent residue removal step, the residue removing liquid, which has the property of dissolving the solute composition that forms the particle holding layer, is supplied to the upper surface of the substrate after the particle holding layer has been removed. It is, thereby, possible to dissolve residues of the particle holding layer and remove the residues of the particle holding layer from the upper surface of the substrate.

Therefore, according to this configuration, the particle holding layer can be peeled from the upper surface of the substrate together with particles held therein to remove the particles at a high removal efficiency. Further, it is possible to suppress residues of the particle holding layer from remaining on the upper surface of the substrate or being attached again thereto.

Still further, according to this configuration, it is possible to execute the heating step included in the film forming step by a simple heating means (heating medium supplying unit) which supplies a heating medium to the lower surface of the substrate.

Therefore, there is eliminated a necessity for providing, for example, an electric heater, etc., inside a chamber or executing a heating step by transferring the substrate to another chamber having an electric heater, etc. That is, it is possible to simplify, a configuration of the substrate cleaning apparatus.

The present invention also provides a third substrate cleaning apparatus which includes a processing liquid supplying unit which supplies a processing liquid that includes a solute and a solvent, which has volatility, to an upper surface of a substrate, a heating unit in which the substrate is heated to volatilize at least partially the solvent, by which the processing liquid is solidified or hardened to forma particle holding layer on the upper surface of the substrate, a peeling liquid supplying unit which supplies a peeling liquid, which peels the particle holding layer, to the upper surface of the substrate, a residue removing liquid supplying unit which supplies to the upper surface of the substrate a residue removing liquid which removes residues that remain on the upper surface of the substrate after the particle holding layer has been peeled and removed, and a controller which controls the processing liquid supplying unit, the heating unit, the peeling liquid supplying unit and the residue removing liquid supplying unit. The residue removing liquid has the property of dissolving a solute composition which is the solute included in the particle holding layer. The controller is programmed so as to execute a processing liquid supplying step of supplying the processing liquid to the upper surface of the substrate, a film forming step in which the solvent is at least partially volatilized from the processing liquid supplied to the upper surface of the substrate and the processing liquid is heated at a temperature less than a boiling point of the solvent, thereby forming the particle holding layer on the upper surface of the substrate, a removal step in which the peeling liquid is supplied to the upper surface of the substrate, thereby peeling and removing the particle holding layer from the upper surface of the substrate, and a residue removal step in which the residue removing liquid is supplied to the upper surface of the substrate, thereby removing residues that remain on the upper surface of the substrate after the particle holding layer has been removed.

According to this configuration, the processing liquid is solidified or hardened in the film forming step which includes the heating step. Thereby, the particle holding layer which can be peeled by the peeling liquid is formed on the upper surface of the substrate.

When the processing liquid is solidified or hardened, particles are separated from the substrate. The separated particles are held in the particle holding layer. Therefore, the peeling liquid is supplied to the upper surface of the substrate in the removal step, by which the particle holding layer formed on the upper surface of the substrate can be peeled and removed from the upper surface of the substrate together with particles held in the particle holding layer.

Further, in the subsequent residue removal step, a residue removing liquid which has the property of dissolving a solute composition that forms the particle holding layer is supplied to the upper surface of the substrate after the particle holding layer has been removed. It is, thereby, possible to dissolve residues of the particle holding layer and remove them from the upper surface of the substrate.

Therefore, according to this configuration, the particle holding layer can be peeled from the upper surface of the substrate together with particles held therein to remove the particles at a high removal efficiency. Moreover, it is possible to suppress residues of the particle holding layer from remaining on the upper surface of the substrate or being attached again thereto.

Still further, according to this configuration, the solvent is allowed to remain in the particle holding layer after being heated in the heating step included in the film forming step. Therefore, it is possible to easily peel the particle holding layer from the upper surface of the substrate by interactions between the solvent remaining in the particle holding layer and the peeling liquid supplied in the subsequent removal step. In other words, the peeling liquid is permeated into the particle holding layer and brought to an interface with the substrate, by which the particle holding layer can be peeled by being floated from the upper surface of the substrate.

The above-described and yet other objects, features and effects of the present invention will be made clear by the following description of the preferred embodiments with reference to the accompanying drawings.

BRIEF DESCRIPTION OF THE DRAWINGS

FIG. 5A to FIG. 5H are each an illustrative sectional view which describes a mode of the substrate cleaning.

FIG. 9 is a schematic sectional view which shows a brief configuration of a processing unit according to a second preferred embodiment of the present invention.

DETAILED DESCRIPTION OF THE PREFERRED EMBODIMENTS

First Preferred Embodiment

Figure 1:
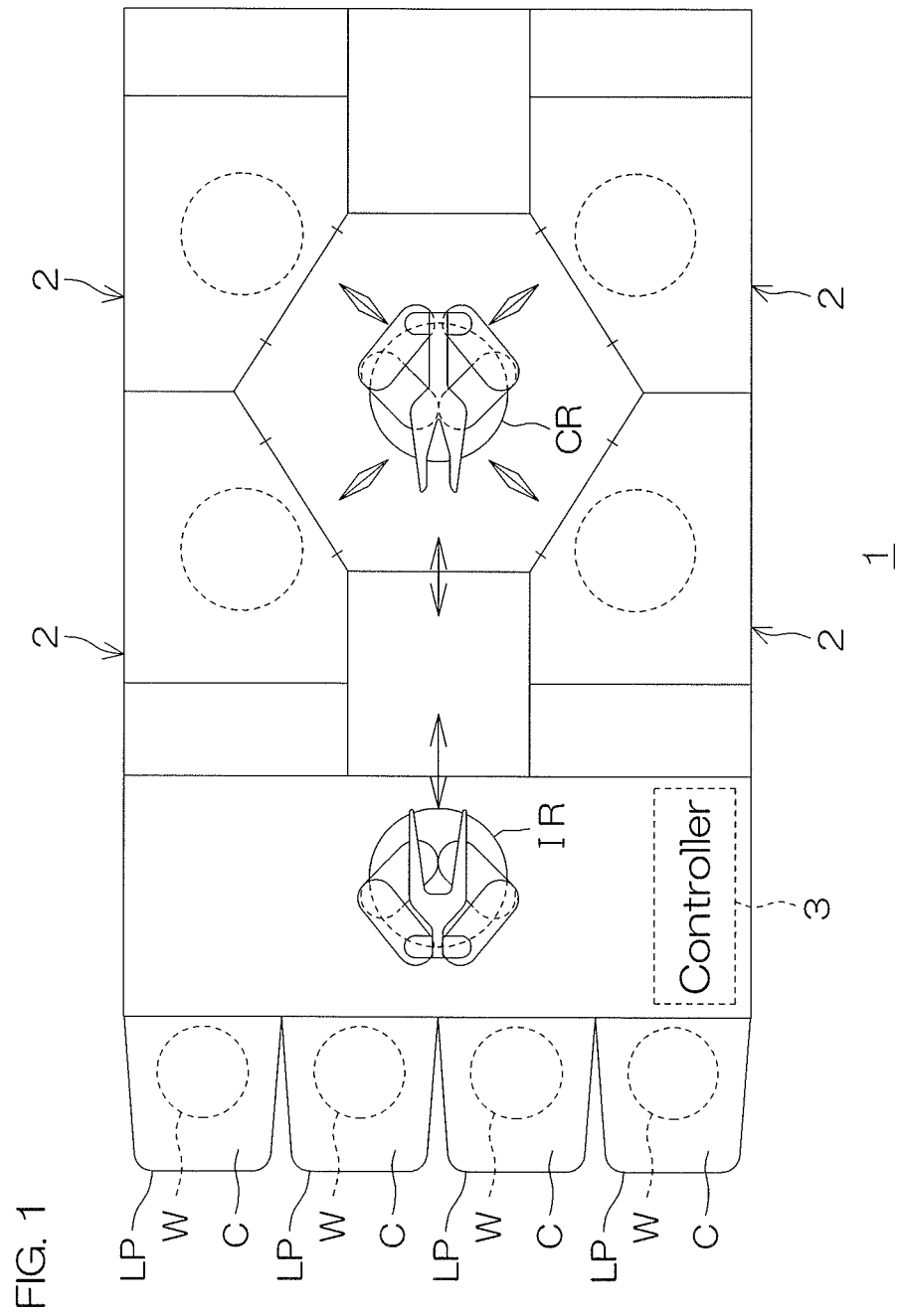
FIG. 1 is an illustrative plan view which shows a layout of a substrate cleaning apparatus according to a first preferred embodiment of the present invention.

FIG. 1 is an illustrative plan view which shows a layout of a substrate cleaning apparatus 1 according to the first preferred embodiment of the present invention. The substrate cleaning apparatus 1 is a single substrate processing type apparatus which cleans a substrate W such as a silicon wafer one at a time. In the present preferred embodiment, the substrate W is a disk-shaped substrate.

The substrate cleaning apparatus 1 includes a plurality of processing units 2 which clean a substrate W, a load port LP at which a carrier C for housing a plurality of substrates W cleaned by the processing units 2 is placed, transfer robots IR and CR which transfer a substrate W between the load port LP and the processing unit 2, and a controller 3 which controls the substrate cleaning apparatus 1.

The transfer robot IR transfers a substrate W between the carrier C and the transfer robot CR. The transfer robot CR transfers a substrate W between the transfer robot IR and the processing unit 2. The plurality of processing units 2 are, for example, similar in configuration to each other.

Figure 2:
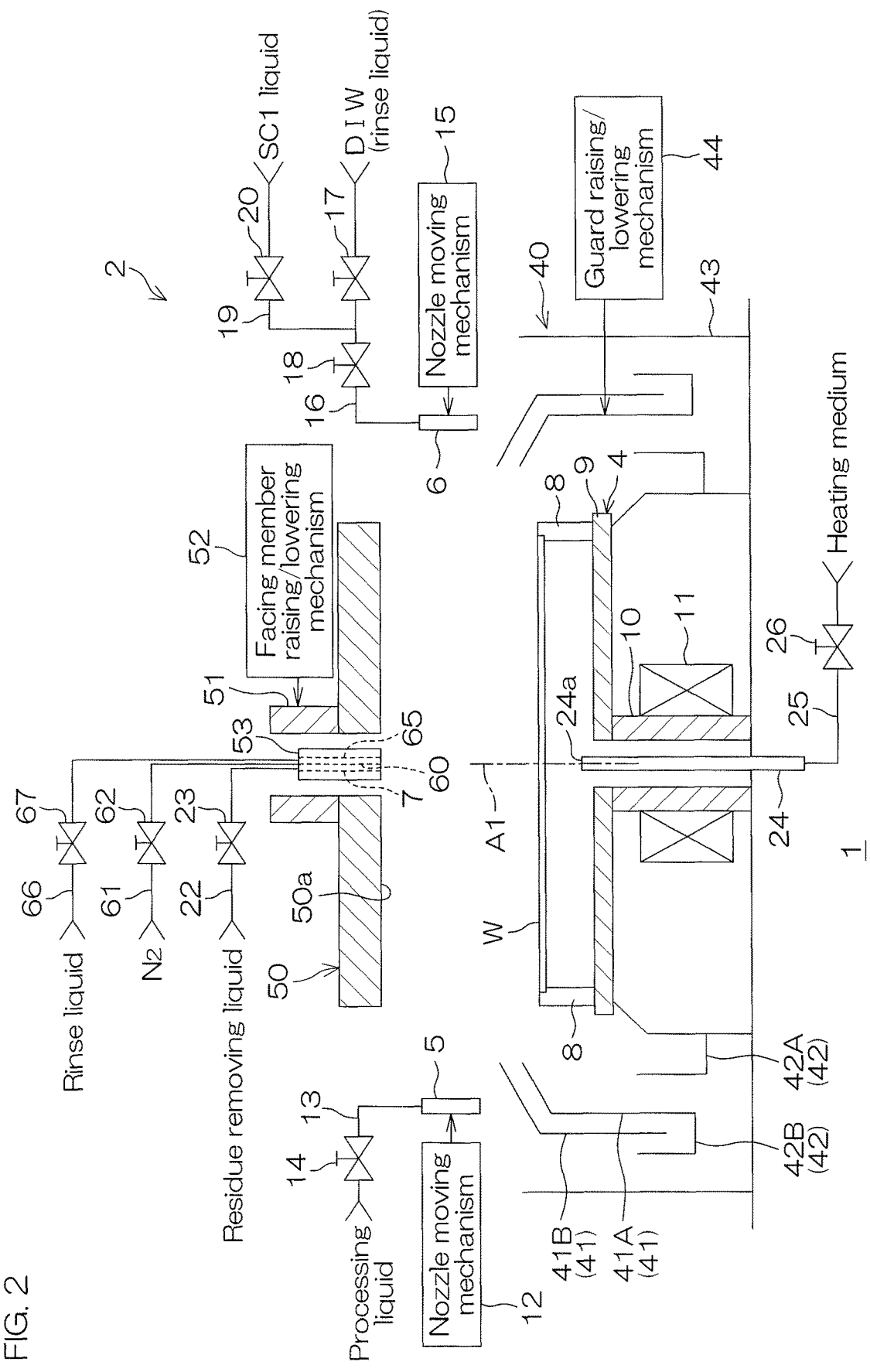
FIG. 2 is a schematic sectional view which shows a brief configuration of a processing unit which is disposed at the substrate cleaning apparatus.

FIG. 2 is a schematic sectional view which shows a brief configuration of the processing unit 2 disposed in the substrate cleaning apparatus 1.

The processing unit 2 includes a spin chuck 4 which holds a single substrate W in a horizontal posture and rotates the substrate W in a vertical rotation axis A1 which passes through a central portion of the substrate W, a processing liquid supplying nozzle 5 which supplies a processing liquid that contains a solute and a volatile solvent to an upper surface of the substrate W held by the spin chuck 4, and a peeling liquid supplying nozzle 6 which supplies a peeling liquid to the upper surface of the substrate W held by the spin chuck 4. The processing liquid supplying nozzle 5 is an example of the processing liquid supplying unit. The peeling liquid supplying nozzle 6 is an example of the peeling liquid supplying unit.

The spin chuck 4 includes a chuck pin 8, a spin base 9, a rotating shaft 10 and a spin motor 11 which rotates a substrate W around the rotation axis A1.

The rotating shaft 10 extends in a vertical direction along the rotation axis A1 and is a hollow shaft in the preferred embodiment. An upper end of the rotating shaft 10 is coupled to a lower surface center of the spin base 9. The spin base 9 has a disk shape along a horizontal direction. The plurality of chuck pins 8 for gripping a substrate W are disposed at intervals in a circumferential direction at a peripheral edge portion of an upper surface of the spin base 9. The spin motor 11 includes, for example, an electric motor which applies a rotating force to the rotating shaft 10, thereby rotating the substrate W, the chuck pin 8, the spin base 9 and the rotating shaft 10 integrally around the rotation axis A1.

The processing liquid supplying nozzle 5 is moved by a first nozzle moving mechanism 12, for example, in a horizontal direction (a direction perpendicular to the rotation axis A1). The processing liquid supplying nozzle 5 can be moved by movement in the horizontal direction between a central position and a retracted position. When the processing liquid supplying nozzle 5 is positioned at the central position, the processing liquid supplying nozzle 5 faces a rotation center position of the upper surface of a substrate W. When the processing liquid supplying nozzle 5 is positioned at the retracted position, the processing liquid supplying nozzle 5 does not face the upper surface of the substrate W. The rotation center position in the upper surface of the substrate W is a position of the upper surface of the substrate W which intersects the rotation axis A1. The retracted position of not facing the upper surface of the substrate W is a position which, in a plan view, is at the outer side of the spin base 9. A processing liquid supplying pipe 13 is connected to the processing liquid supplying nozzle 5. A valve 14 which opens and closes a flow passage thereof is interposed in the processing liquid supplying pipe 13.

The peeling liquid supplying nozzle 6 is moved by a second nozzle moving mechanism 15, for example, in a horizontal direction (a direction perpendicular to the rotation axis A1). The peeling liquid supplying nozzle 6 can be moved by movement in the horizontal direction between a central position and a retracted position. When the peeling liquid supplying nozzle 6 is positioned at the central position, the peeling liquid supplying nozzle 6 faces a rotation center position of the upper surface of a substrate W. When the peeling liquid supplying nozzle 6 is positioned at the retracted position, the peeling liquid supplying nozzle 6 does not face the upper surface of the substrate W. A supplying pipe 16 for DIW as a first peeling liquid is connected to the peeling liquid supplying nozzle 6. Valves 17 and 18 which open and close a flow passage thereof are interposed in the supplying pipe 16.

A supplying pipe 19 for an SC1 liquid as a second peeling liquid, that is, ammonia water and hydrogen peroxide aqueous solution, is also connected to the peeling liquid supplying nozzle 6. The supplying pipe 19 is connected to a downstream side from the valve 17 and an upstream side from the valve 18, of the supplying pipe 16. A valve 20 which opens and closes a flow passage thereof is interposed in the supplying pipe 19.

The processing unit 2 includes a processing cup 40 which receives a liquid expelled from the upper surface and a lower surface of a substrate W held by the spin chuck 4 to the outside of the substrate W and a facing member 50 which faces the substrate W held by the spin chuck 4 from above.

The processing cup 40 includes a plurality of guards 41 which receive a liquid scattering to the outer side from a substrate W held by the spin chuck 4, a plurality of cups 42 which receive a liquid guided downward by the plurality of guards 41, and a cylindrical outer wall member 43 which surrounds the plurality of guards 41 and the plurality of cups 42. The present preferred embodiment shows an example in which two guards 41 (a first guard 41A and a second guard 41B) and two cups 42 (a first cup 42A and a second cup 42B) are provided.

The first cup 42A and the second cup 42B are each formed in a groove shape which is opened upward. The first guard 41A surrounds the spin base 9. The second guard 41B surrounds the spin base 9 at the outer side in a radial direction from the first guard 41A. The first cup 42A receives a liquid guided downward by the first guard 41A. The second cup 42B is formed integrally with the first guard 41A and receives a liquid guided downward by the second guard 41B.

The processing unit 2 includes a guard raising/lowering mechanism 44 which independently raises and lowers the first guard 41A and the second guard 41B. The guard raising/lowering mechanism 44 raises and lowers the first guard 41A between a lower position and an upper position. The guard raising/lowering mechanism 44 raises and lowers the second guard 41B between a lower position and a upper position. The first guard 41A is positioned at a side of a substrate W in an entire movable range between the upper position and the lower position. The second guard 41B is positioned at a side of the substrate W in an entire movable range between the upper position and the lower position. The upper position and the lower position are included in the movable range.

When the first guard 41A and the second guard 41B are both positioned at the upper position, a liquid scattered from a substrate W is received by the first guard 41A. When the first guard 41A is positioned at the lower position and the second guard 41B is positioned at the upper position, a liquid scattering from a substrate W is received by the second guard 41B.

The guard raising/lowering mechanism 44 includes, for example, a first ball screw mechanism (not shown) mounted on the first guard 41A, a first motor (not shown) which applies a driving force to a first ball screw mechanism, a second ball screw mechanism (not shown) mounted on the second guard 41B and a second motor (not shown) which applies a driving force to the second ball screw mechanism.

The facing member 50 is formed in a disk shape so as to have a diameter substantially equal to or larger than that of a substrate W and disposed substantially horizontally above the spin chuck 4. The facing member 50 has a facing surface 50a which faces the upper surface of a substrate W.

A hollow shaft 51 is fixed to a surface opposite to the facing surface 50a of the facing member 50. A communication hole which penetrates through the facing member 50 in an up/down direction and is communicatively connected with an internal space of the hollow shaft 51 is formed at a portion which includes a position of the facing member 50 which overlaps the rotation axis A1 in a plan view.

The facing member 50 blocks the atmosphere inside a space between the facing surface 50a of the facing member 50 and the upper surface of a substrate W from an external atmosphere of the space. Therefore, the facing member 50 is also referred to as a blocking plate.

The processing unit 2 further includes a facing member raising/lowering mechanism 52 which drives the facing member 50 so as to be raised and lowered. The facing member raising/lowering mechanism 52 is able to position the facing member 50 at any given position (height) from a lower position (a position shown in FIG. 5H which will be described later) to an upper position (a position shown in FIG. 5A which will be described later). The lower position is a position at which the facing surface 50a of the facing member 50 comes closest to a substrate W in a movable range of the facing member 50. The upper position is a position (retracted position) at which the facing surface 50*a* of the facing member 50 is most distant from a substrate W in a movable range of the facing member 50. When the facing member 50 is positioned at the upper position, the processing liquid supplying nozzle 5 and the peeling liquid supplying nozzle 6 are able to enter between the facing surface 50*a* of the facing member 50 and the upper surface of the substrate W.

The facing member raising/lowering mechanism 52 includes, for example, a ball screw mechanism (not shown) mounted on a supporting member (not shown) for supporting the hollow shaft 51 and an electric motor (not shown) which applies a driving force thereto.

The processing unit 2 further includes a residue removing liquid supplying nozzle 7 which supplies a residue removing liquid to the upper surface of the substrate W held by the spin chuck 4, a gas supplying nozzle 60 which supplies a gas to a space between the upper surface of the substrate W held by the spin chuck 4 and the facing surface 50*a* of the facing member 50, and a rinse liquid supplying nozzle 65 which supplies a rinse liquid to the upper surface of the substrate W held by the spin chuck 4. The residue removing liquid supplying nozzle 7 is an example of the residue removing liquid supplying unit. The gas supplying nozzle 60 is an example of the gas supplying unit. The rinse liquid supplying nozzle 65 is an example of the rinse liquid supplying unit.

A residue removing liquid supplying pipe 22 is connected to the residue removing liquid supplying nozzle 7. A valve 23 which opens and closes a flow passage in the residue removing liquid supplying pipe 22 is interposed in the residue removing liquid supplying pipe 22. A gas supplying pipe 61 is connected to the gas supplying nozzle 60. A valve 62 which opens and closes a flow passage in the gas supplying pipe 61 is interposed in the gas supplying pipe 61. A rinse liquid supplying pipe 66 is connected to the rinse liquid supplying nozzle 65. A valve 67 which opens and closes a flow passage in the rinse liquid supplying pipe 66 is interposed in the rinse liquid supplying pipe 66.

The residue removing liquid supplying nozzle 7, the gas supplying nozzle 60 and the rinse liquid supplying nozzle 65 are commonly housed in a nozzle housing member 53 which is inserted into the hollow shaft 51. Discharge ports of the residue removing liquid supplying nozzle 7, the gas supplying nozzle 60 and the rinse liquid supplying nozzle 65 are exposed from a lower end portion of the nozzle housing member 53. The lower end portion of the nozzle housing member 53 faces a central region of the upper surface of the substrate W held by the spin chuck 4.

The processing unit 2 further includes a heating medium supplying nozzle 24 which supplies a heating medium for heating a substrate W to a rear surface (lower surface) of the substrate W held by the spin chuck 4. The heating medium supplying nozzle 24 is an example of the heating unit which heats the substrate W, which is held by the chuck pin 8 and the spin base 9, from the rear surface side of the substrate W, thereby forming a particle holding layer on the upper surface of the substrate W.

The heating medium supplying nozzle 24 supplies a heating medium to the rear surface of the substrate W substantially in its entirety, thereby heating a processing liquid on the upper surface of the substrate W. The heating medium supplying nozzle 24 is inserted through the rotating shaft 10 and provided at an upper end thereof with a discharge port 24*a* which is located at a central portion of the rear surface of the substrate W. Warm pure water is one example of the heating medium.

In the present preferred embodiment, the heating medium supplying nozzle 24 supplies a heating medium toward a central position of the rear surface of the substrate W in a rotating state from the discharge port 24*a*. The supplied heating medium spreads across the rear surface of the substrate W substantially in its entirety by actions of a centrifugal force. Thereby, the substrate W and the processing liquid on the upper surface of the substrate W are heated. The rotation center position in the rear surface of the substrate W is a position of the rear surface of the substrate W which intersects the rotation axis A1. A heating medium supplying pipe 25 is connected to the heating medium supplying nozzle 24. A valve 26 which opens and closes a flow passage in the heating medium supplying pipe 25 is interposed in the heating medium supplying pipe 25.

Figure 3:
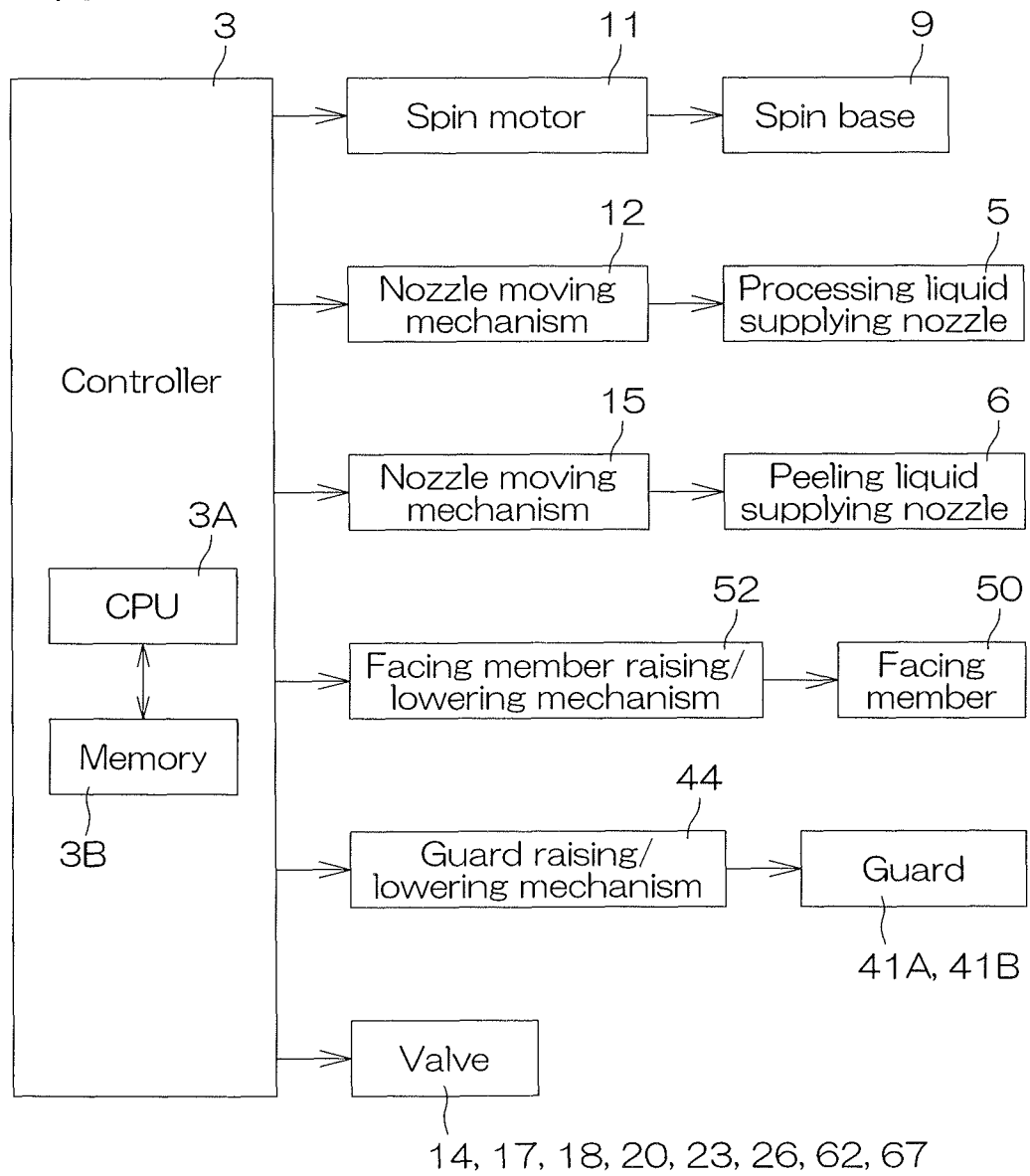
FIG. 3 is a block diagram which shows an electrical configuration of main portions in the substrate cleaning apparatus.

FIG. 3 is a block diagram which shows an electrical configuration of main portions in the substrate cleaning apparatus 1.

The substrate cleaning apparatus 1 includes a controller 3. The controller 3 is provided with a microcomputer and controls control targets disposed in the substrate cleaning apparatus 1 in accordance with predetermined control programs. Specifically, the controller 3 includes a processor (CPU) 3A and a memory 3B in which the control programs are housed, and is constituted so as to execute various types of control for the substrate processing according to the control programs executed by the processor 3A.

The controller 3 is programmed so as to control in particular the spin motor 11, the first nozzle moving mechanism 12, the second nozzle moving mechanism 15, the facing member raising/lowering mechanism 52, the guard raising/lowering mechanism 44 and valves 14, 17, 18, 20, 23, 26, 62, 67.

Figure 4:
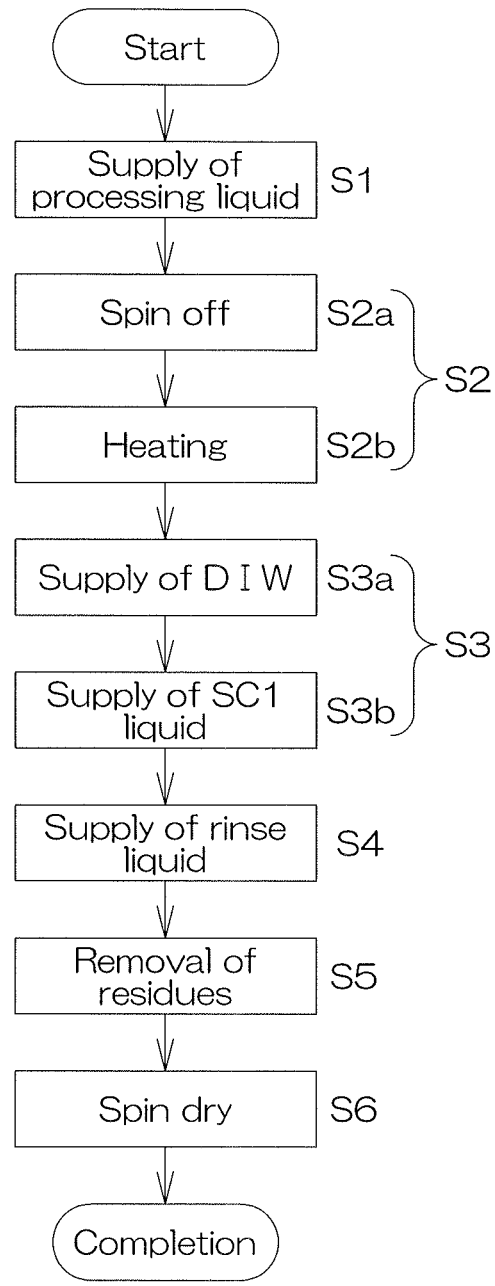
FIG. 4 is a flowchart which describes one example of substrate cleaning by the processing unit.
Figure 5C:
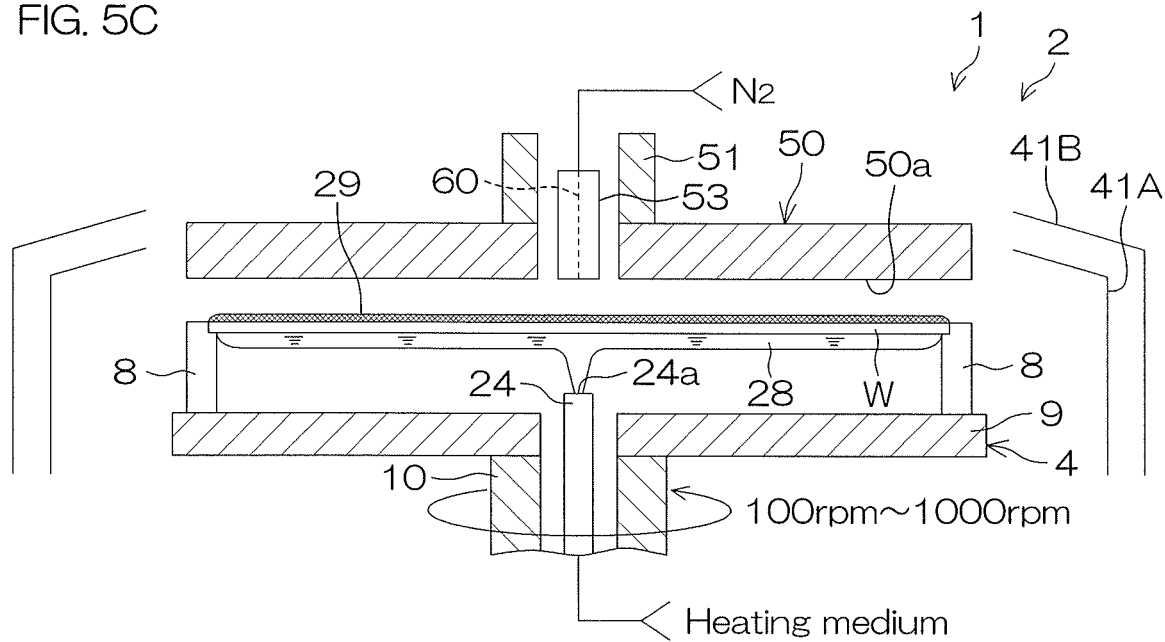
Figure 5D:
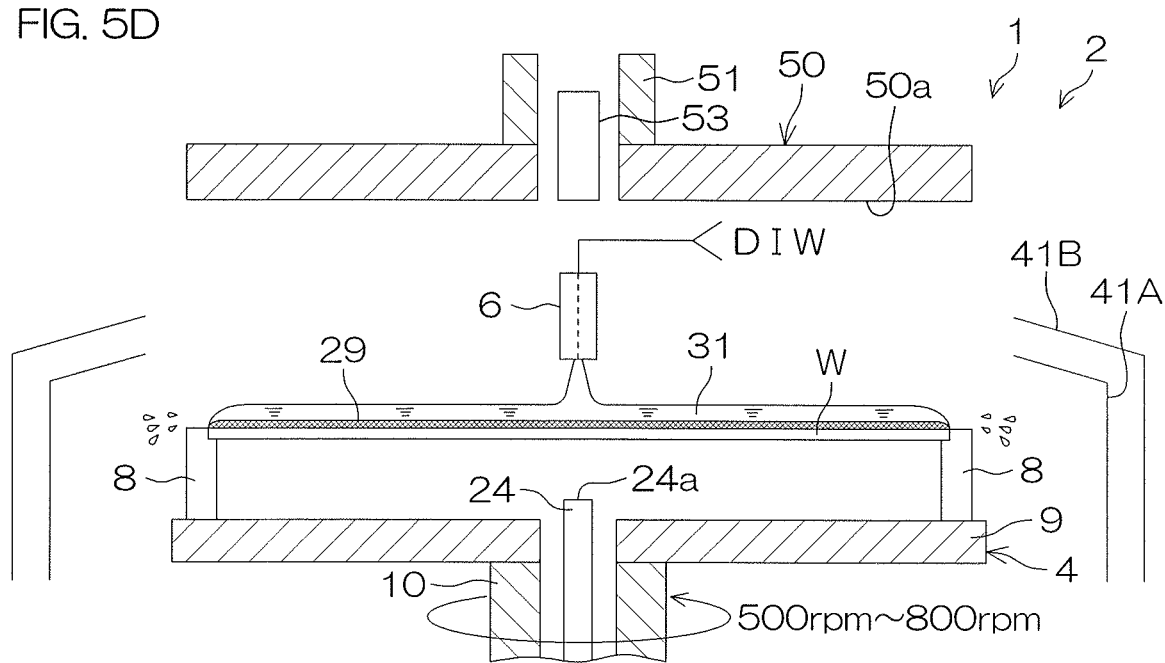
Figure 5E:
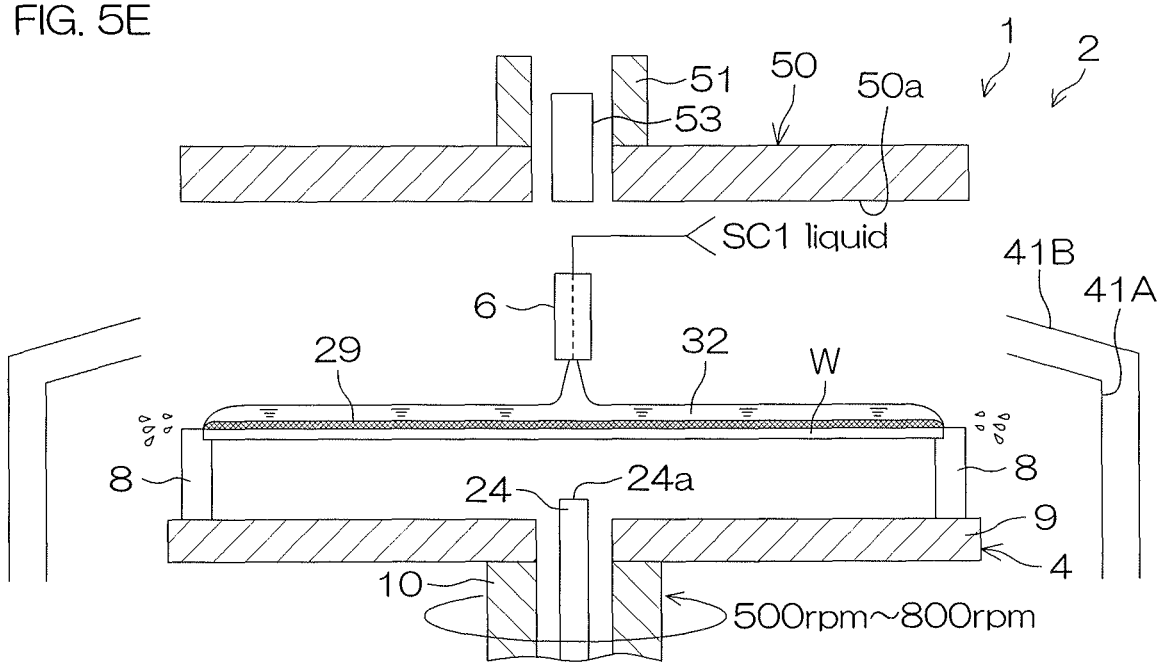
Figure 5F:
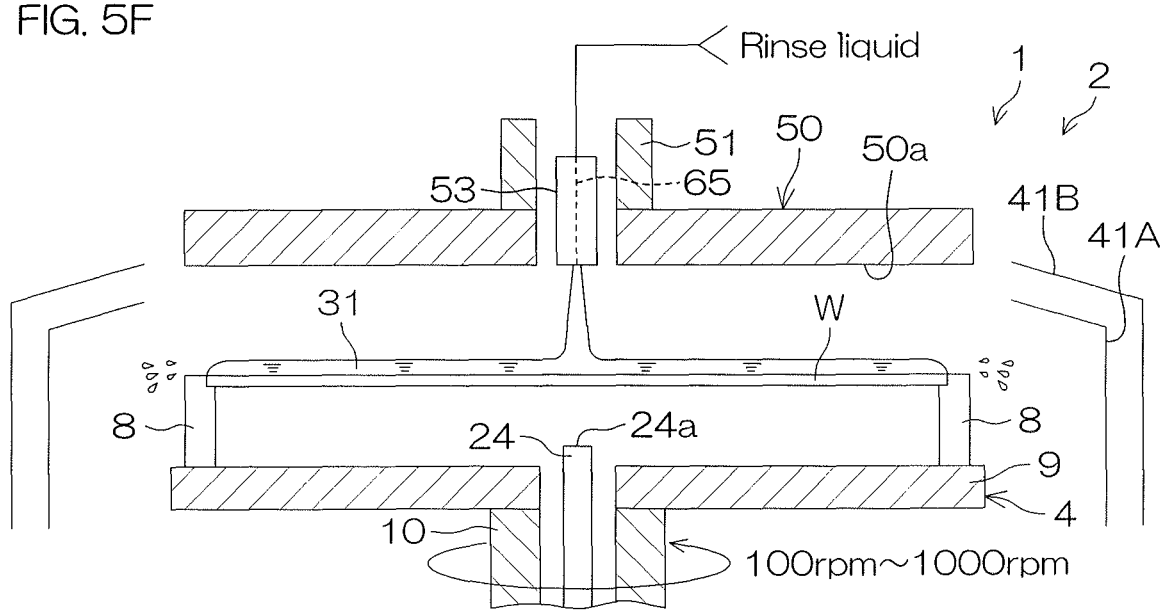
Figure 5G:
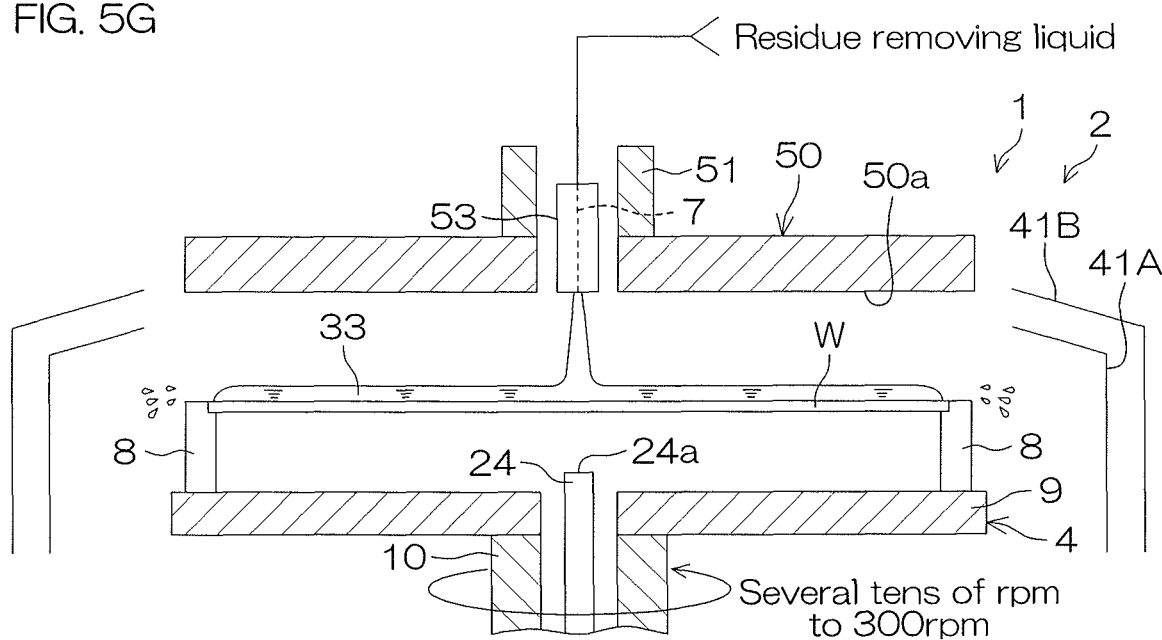
Figure 5H:
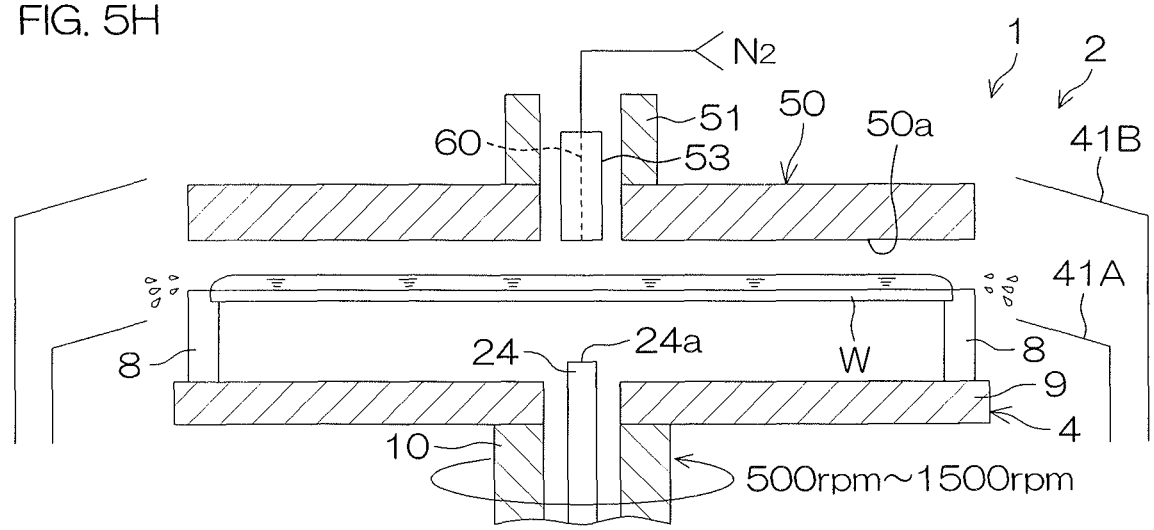
Figure 6A:
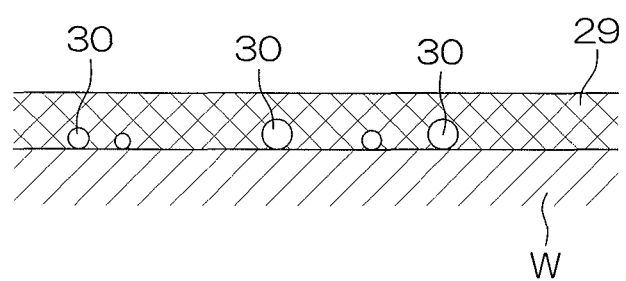
FIG. 6A and FIG. 6B are each an illustrative sectional view which describes a mode of a particle holding layer in the substrate cleaning.
Figure 6B:
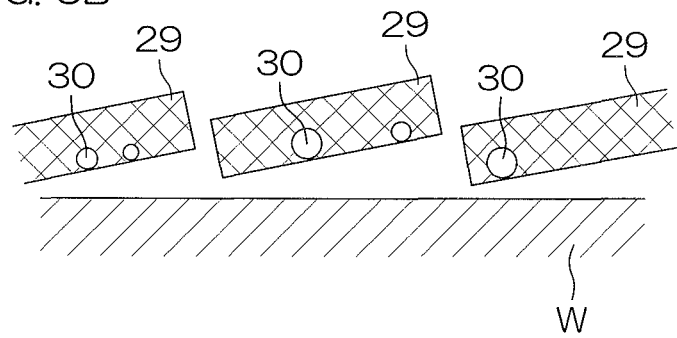

FIG. 4 is a flowchart which describes an example of the substrate cleaning by the processing unit 2. FIG. 5A to FIG. 5H are each an illustrative sectional view which describes a mode of an example of the substrate cleaning. FIG. 6A and FIG. 6B are each an illustrative sectional view which describe a mode of the particle holding layer 29 in an example of the substrate cleaning.

In the substrate cleaning by the processing unit 2, the processing liquid supplying step is at first executed (Step S1). In the processing liquid supplying step, the controller 3 at first drives the spin motor 11 to rotate the spin base 9, thereby starting rotation of a substrate W. In the processing liquid supplying step, the spin base 9 is rotated at a predetermined processing liquid supplying speed as a substrate rotating speed. The processing liquid supplying speed is, for example, from 10 rpm to several tens of rpm. Further, the controller 3 controls the facing member raising/lowering mechanism 52 to dispose the facing member 50 at the upper position. Further, the controller 3 controls the guard raising/lowering mechanism 44 to dispose the first guard 41A and the second guard 41B at the upper position.

Next, the controller 3 controls the first nozzle moving mechanism 12 to dispose the processing liquid supplying nozzle 5 at the central position above a substrate W. Then, the controller 3 opens the valve 14. Thereby, as shown in FIG. 5A, a processing liquid 27 is supplied from the processing liquid supplying nozzle 5 toward the upper surface of the substrate W in a rotation state. The processing liquid 27 supplied to the upper surface of the substrate W spreads across the upper surface of the substrate W substantially in its entirety by actions of a centrifugal force.

After supply of the processing liquid for a fixed time, executed is a film forming step in which the processing liquid is solidified or hardened to form a particle holding layer on the upper surface of the substrate W (Step S2). In the film forming step, the controller 3 at first closes the valve 14 to stop supply of the processing liquid 27 from the processing liquid supplying nozzle 5. Then, the controller 3 moves the processing liquid supplying nozzle 5 to the retracted position.

Next, the controller 3 controls the spin motor 11, thereby rotating the spin base 9 at a predetermined spin off speed as a substrate rotating speed (spin off step, Step S2a). The spin off speed is, for example, from 300 rpm to 1500 rpm. Thereby, as shown in FIG. 5B, the processing liquid 27 which has been supplied to the upper surface of the substrate W is at first expelled from a peripheral edge of the upper surface of the substrate W and then the volatile solvent proceeds to volatilize.

Next, the controller 3 controls the facing member raising/lowering mechanism 52 such that the facing member 50 will move from the upper position to the lower position. The controller 3 opens the valve 62. Thereby, a gas such as nitrogen ($N_2$) gas is supplied from the gas supplying nozzle 60 to a space between the facing surface 50a of the facing member 50 and the upper surface of the substrate W. Further, the controller 3 controls the spin motor 11, thereby rotating the spin base 9 at a predetermined speed at the time of heating as a substrate rotating speed. The speed at the time of heating is, for example, from 100 rpm to 1500 rpm. After the facing member 50 has reached the lower position, the controller 3 opens the valve 26. Thereby, as shown in FIG. 5C, a heating medium 28 is supplied from the heating medium supplying nozzle 24 toward the rear surface of the substrate W in the rotation state.

The supplied heating medium 28 spreads across the rear surface of the substrate W substantially in its entirety by actions of a centrifugal force. Thereby, the substrate W and the processing liquid 27 on the upper surface of the substrate W is heated (heating step, Step S2b).

Then, the volatile solvent further proceeds to volatilize, and the processing liquid 27 is also solidified or hardened. Thereby, a solid-state film which is made of a solute composition, that is, a particle holding layer 29 is formed. Further, as shown in FIG. 6A, when the particle holding layer 29 is formed, particles 30 attached to the upper surface of the substrate W are separated from the substrate W and held in the particle holding layer 29.

Here, "solidification" means that, for example, in association with volatilization of a solvent, a solute is made solid by a force, etc., acting between molecules or between atoms. "Hardening" means that, for example, by chemical changes such as polymerization and cross linkage, a solute is made solid. Therefore, "solidification or hardening" means that a solute is "made solid" by various factors. It is sufficient that the processing liquid is solidified or hardened to such an extent that the particles 30 can be held and it is not necessary that a solvent is completely volatilized. Further, the "solute composition" which forms the particle holding layer 29 may be a solute in itself which is contained in the processing liquid 27 or may be a substance derived from a solute, for example, a substance resulting from a chemical change.

As the solute, there can be used various types of resins which are soluble in any given solvent and also which are able to form the particle holding layer 29 in a state that the particles 30 attached to an upper surface of a substrate W are held in separation from the substrate W at the time of solidification or hardening.

For example, in the present preferred embodiment, as the solute, there is used a resin which has such properties that the resin is hardly soluble or insoluble in water before being heated at a temperature equal to or higher than a predetermined quality-changing temperature, and the resin is changed in quality by being heated at a temperature equal to or higher than the quality-changing temperature and becomes soluble in water (hereinafter, referred to as a "heat-sensitive water soluble resin" from time to time). A cleaning method according to a preferred embodiment of the present invention is executed by combining the heat-sensitive water soluble resin with a water-based peeling liquid which will be described later.

As the heat-sensitive water soluble resin, for example, such a resin, that undergoes decomposition by being heated at a temperature equal to or higher than the predetermined quality-changing temperature (for example, 200° C. or higher), thereby exhibiting water solubility, with a polar functional group being exposed, can be used.

According to the present preferred embodiment, in the film forming step, the processing liquid is heated at a temperature less than the quality-changing temperature of the heat-sensitive water soluble resin, thereby forming the particle holding layer 29 which is hardly soluble or insoluble in a water-based peeling liquid on the upper surface of the substrate W, without changing the quality of the heat-sensitive water soluble resin to water soluble.

In order to heat the processing liquid at a temperature less than a quality-changing temperature of the heat-sensitive water soluble resin, as the heating medium, there may be used such a heating medium that a boiling point thereof is less than the quality-changing temperature. Where there is used, for example, a heat-sensitive water soluble resin having a quality-changing temperature of 180° C., for example, DIW (boiling point: 100° C.), etc., can be used as the heating medium.

The heating temperature is more preferably a temperature less than a boiling point of the solvent. The processing liquid is heated at a temperature less than a boiling point of the solvent, by which, as described previously, the solvent is allowed to remain in the particle holding layer 29. Then, it is possible to easily peel the particle holding layer 29 from the upper surface of the substrate W by interactions between the solvent remaining in the particle holding layer 29 and the peeling liquid.

As described above, the heat-sensitive water soluble resin is changed to water soluble when being heated at a temperature equal to or higher than the quality-changing temperature. Therefore, it can be used, for example, in the conventional method described in Japanese Patent Application Publication No. 2014-197717 and the conventional method described in United States Patent Application Publication No. 2015/128994. However, in the present preferred embodiment, the particle holding layer 29 is formed in a state where the heat-sensitive water soluble resin is kept hardly soluble or insoluble in the water-based peeling liquid by intentionally keeping heated at a temperature less than the quality-changing temperature. Therefore, it is possible to remove the particle holding layer 29 kept in an aggregated form from a substrate W without dropping the particles 30 from the particle holding layer 29. It is thus possible to remove the particles 30 at a high removal efficiency.

Further, in the present preferred embodiment, the heating temperature can be set at a temperature less than the quality-changing temperature which is lower than that of the conventional method. Therefore, it is possible to reduce energy consumption on executing the cleaning method. In detail, since the particle holding layer 29 may be heated at a temperature less than 100° C., DIW can be used as a heating means for heating a substrate W. On the other hand, unlike the present preferred embodiment, in a configuration in which the particle holding layer 29 is heated at a temperature equal to or higher than 100° C., it is necessary to use, as a heating means, a liquid which will not evaporate even at a high temperature (for example, a liquid having a boiling point higher than 100° C.). Therefore, the heating temperature can be set at a temperature less than the quality-changing temperature, thus making it possible to realize heating of a substrate W by using a safe and simple configuration.

As the solvent, there can be used a solvent which has the property of dissolving a heat-sensitive water soluble resin before a change in quality and which is volatile. As the solvent, for example, PGEE can be used.

As previously described, the heating of a substrate W by the heating medium 28 (heating step) is carried out in a state that the facing surface 50a of the facing member 50 is brought close to the upper surface of the substrate W (for example, in a state that the facing member 50 is positioned at the lower position).

The heating medium 28 supplied to the rear surface of the substrate W spreads across the rear surface of the substrate W substantially in its entirety and, thereafter, splashes outside the substrate W by a centrifugal force. The heating medium 28 which is splashed outside the substrate W is received by the first guard 41A. The heating medium 28 received by the first guard 41A is partially splashed around from the first guard 41A.

Thus, in the present preferred embodiment, the heating step is executed in a state that the facing surface 50a of the facing member 50 is brought close to an upper surface of a substrate W. The facing member 50 protects the upper surface of the substrate W from the heating medium 28 splashed around from the first guard 41A. Therefore, it is possible to suppress the heating medium 28 from being attached to a surface of the particle holding layer 29 and also to suppress particles by the heating medium 28 which is splashed around from the first guard 41A.

Further, in the present preferred embodiment, as previously described, a gas is supplied from the gas supplying nozzle 60 to a space between the facing surface 50a of the facing member 50 and the upper surface of the substrate W. The gas which is supplied to a space between the facing surface 50a of the facing member 50 and the upper surface of the substrate W forms a gas flow which moves from a central region of the upper surface of the substrate W toward a peripheral edge of the upper surface of the substrate W. The gas flow which moves from the central region of the upper surface of the substrate W to a peripheral edge of the upper surface of the substrate W is formed, by which the heating medium 28 splashed around from the first guard 41A can be pushed backward to the first guard 41A. Therefore, it is possible to further suppress the heating medium 28 from being attached to a surface of the particle holding layer 29.

The gas which is supplied to a space between the facing surface 50a of the facing member 50 and the upper surface of the substrate W is not limited to nitrogen gas. The gas which is supplied to a space between the facing surface 50a of the facing member 50 and the upper surface of the substrate W is preferably an inert gas and may be an inert gas other than nitrogen gas. The inert gas is a gas which is inactive to the upper surface of the substrate W or a pattern and may be a rare gas such as argon, etc.

After heating for a fixed time, the controller 3 closes the valve 26 to stop supply of a heating medium from the heating medium supplying nozzle 24. Then, there is executed the removal step in which the particle holding layer 29 is peeled and removed from an upper surface of a substrate W (Step S3).

That is, the controller 3 controls the spin motor 11, thereby rotating the spin base 9 at a predetermined removal speed as a substrate rotating speed. The removal speed is, for example, from 500 rpm to 800 rpm.

The controller 3 controls the facing member raising/lowering mechanism 52 to dispose the facing member 50 at the upper position. Then, the controller 3 closes the valve 62. Thereby, supply of a gas from the gas supplying nozzle 60 is stopped. Further, the controller 3 controls the second nozzle moving mechanism 15 to dispose the peeling liquid supplying nozzle 6 at the central position above a substrate W. Then, the controller 3 opens the valves 17, 18, while keeping the valve 20 closed. Thereby, as shown in FIG. 5D, DIW 31 is supplied as a first peeling liquid from the peeling liquid supplying nozzle 6 toward the upper surface of the substrate W in the rotation state (DIW supplying step, Step S3a). The DIW 31 supplied to the upper surface of the substrate W spreads across the upper surface of the substrate W substantially in its entirety by actions of a centrifugal force and is expelled from a peripheral edge of the upper surface of the substrate W.

Next, the controller 3 opens the valve 20 after closing the valve 17 to stop supply of DIW, while rotating the spin base 9 while maintaining the substrate rotating speed at the removal speed. Thereby, as shown in FIG. 5E, an SC1 liquid 32 is supplied, as an example of the second peeling liquid, from the peeling liquid supplying nozzle 6 toward the upper surface of the substrate W in the rotation state (SC1 liquid supplying step, Step S3b). The SC1 liquid 32 supplied to the upper surface of the substrate W spreads across the upper surface of the substrate W substantially in its entirety by actions of a centrifugal force and replaces the DIW 31, and the SC1 liquid 32 is expelled from the peripheral edge of the upper surface of the substrate W.

The DIW 31 and the SC1 liquid 32 (hereinafter, they are collectively referred to as "peeling liquid" from time to time) are both compatible with PGEE as a solvent. Further, the particle holding layer 29 which is formed by heating the heat-sensitive water soluble resin at a temperature less than the quality-changing temperature thereof is, as previously described, hardly soluble or insoluble in the DIW 31 and the SC1 liquid 32 which are water-based peeling liquids. Therefore, these peeling liquids will be permeated into the particle holding layer 29 without dissolving the solute composition, which forms the particle holding layer 29, by interactions with PGEE that remains in the particle holding layer 29. Then, the peeling liquid reaches an interface with the substrate W. Thereby, as shown in FIG. 6B, the particle holding layer 29 which keeps the particles 30 held is peeled by being floated from an upper surface of a substrate W.

The particle holding layer 29 which has been peeled from the upper surface of the substrate W is expelled from the peripheral edge of the upper surface of the substrate W together with the peeling liquid by actions of a centrifugal force as a result of rotation of the substrate W. In other words, the particle holding layer 29 which has been peeled from the upper surface of the substrate W is removed.

The DIW 31 is lower in effect as a peeling liquid than the SC1 liquid 32. However, the DIW 31 is supplied prior to the SC1 liquid 32 and is permeated into the particle holding layer 29, thereby replacing at least some of PGEE remaining in the particle holding layer 29. Then, the DIW 31 helps the SC1 liquid 32 which is supplied in a next step to permeate into the particle holding layer 29.

Therefore, it is preferable that, as the peeling liquid, the DIW 31 is supplied prior to supply of the SC1 liquid 32. However, the supplying step (Step S3a) of the DIW 31 may be omitted. In other words, only the SC1 liquid may be used as the peeling liquid.

The first peeling liquid is not limited to the DIW 31 but may include any one of carbonated water, electrolyzed ion water, hydrogen water, ozone water and a hydrochloric acid aqueous solution of dilute concentration (of about 10 ppm to 100 ppm, for example). The second peeling liquid is not limited to the SC1 liquid 32 but may include an alkaline aqueous solution such as ammonia solution, aqueous solution of quaternary ammonium hydroxide such as tetramethylammonium hydroxide and chlorine aqueous solution.

Next, the controller 3 closes the valve 18 and the valve 20 to stop supply of the SC1 liquid and, thereafter, allows the peeling liquid supplying nozzle 6 to move to the retracted position. The controller 3 controls the spin motor 11, thereby rotating the spin base 9 at a predetermined rinse speed as a substrate rotating speed. The rinse speed is, for example, from 100 rpm to 1000 rpm.

Next, the controller 3 controls the facing member raising/lowering mechanism 52 to move the facing member 50 from the upper position to a supply position between the upper position and the lower position. Then, the controller 3 opens the valve 67. Thereby, as shown in FIG. 5F, the DIW 31 is supplied as a rinse liquid from the rinse liquid supplying nozzle 65 toward the upper surface of the substrate W in the rotation state (rinse step, Step S4).

Supply of the rinse liquid from the rinse liquid supplying nozzle 65 is started, for example, after movement to the supply position. Supply of the rinse liquid from the rinse liquid supplying nozzle 65 may be started when the facing member 50 is positioned at the upper position or may be started during movement of the facing member 50 from the upper position to the supply position.

The rinse liquid is not limited to the DIW 31 but may include any one of carbonated water, electrolyzed ion water, hydrogen water, ozone water and a hydrochloric acid aqueous solution of dilute concentration (of about 10 ppm to 100 ppm, for example).

The supplied DIW 31 spreads across an upper surface of a substrate W substantially in its entirety by actions of a centrifugal force and, thereafter, it is expelled from a peripheral edge of the upper surface of the substrate W. Thereby, the SC1 liquid 32 remaining on the upper surface of the substrate is washed away from the upper surface of the substrate W. Further, for example, in a previous step, even where the particle holding layer 29 which has been peeled from the upper surface of the substrate W may remain partially without being removed, it is washed away from the upper surface of the substrate W by the DIW 31.

However, for example, conditions of the previous DIW 31 supplying step (Step S3a) and the SC1 liquid 32 supplying step (Step S3b) can be adjusted so as to remove sufficiently the particle holding layer 29 from the upper surface of the substrate W in both the steps. In this case, the DIW 31 supplying step (Step S4) may be omitted.

Next, the controller 3 closes the valve 67 to stop supply of the DIW 31 from the rinse liquid supplying nozzle 65.

Then, there is executed the residue removal step which removes residues remaining on the upper surface of the substrate W after removal of the particle holding layer 29 (Step S5).

That is, the controller 3 controls the spin motor 11, thereby rotating the spin base 9 at a predetermined residue removing speed as a substrate rotating speed. The residue removing speed is, for example, from several tens of rpm to 300 rpm. The facing member 50 is kept positioned at the supply position. Further, the guard raising/lowering mechanism 44 allows the first guard 41A to move to the lower position and keeps the second guard 41B at the upper position.

Next, the controller 3 opens the valve 23. Thereby, as shown in FIG. 5G, a residue removing liquid 33 is supplied from the residue removing liquid supplying nozzle 7 toward the upper surface of the substrate W in the rotation state.

The residue removing liquid 33 supplied to the upper surface of the substrate W spreads across the upper surface of the substrate W substantially in its entirety by actions of a centrifugal force and replaces the DIW 31. Then, the residue removing liquid 33 supplied to the upper surface of the substrate W dissolves residues of the particle holding layer 29 that remain on the upper surface of the substrate W and, thereafter, is expelled from a peripheral edge of the upper surface of the substrate W.

As the residue removing liquid 33, there can be used a solvent which has the property of dissolving the heat-sensitive water soluble resin before a change in quality. As the solvent, there can be used isopropyl alcohol (IPA), for example. IPA is compatible with water and, therefore, able to smoothly replace DIW as a rinse liquid that remains on the upper surface of the substrate W at the time of starting the residue removal step. IPA is also volatile and, therefore, can be removed quickly from the upper surface of the substrate after the residue removal step.

Next, the controller 3 closes the valve 23 and stops supply of the residue removing liquid 33 from the residue removing liquid supplying nozzle 7. Then, the controller 3 controls the facing member raising/lowering mechanism 52 and allows the facing member 50 to move from the supply position to the lower position. The controller 3 opens the valve 60 to start supply of a gas from the gas supplying nozzle 60. Further, the controller 3 controls the spin motor 11, thereby rotating the spin base 9 at a predetermined spin dry speed as a substrate rotating speed (Step S6). The spin dry speed is, for example, from 500 rpm to 1500 rpm. Start of supplying the gas from the gas supplying nozzle 60 and a change in substrate rotating speed are executed at the same time, for example.

By rotation of the substrate W, a centrifugal force is applied to the residue removing liquid 33. As shown in FIG. 5H, the residue removing liquid 33 is expelled from the peripheral edge of the upper surface of the substrate W and also volatilized and removed from the upper surface of the substrate W. Spin dry is carried out to complete a series of cleaning steps. Thereafter, the controller 3 closes the valve 62 to stop supply of the gas from the gas supplying nozzle 60.

As the solute contained in the processing liquid, in addition to a heat-sensitive water soluble resin, there can be used, for example, acrylic resin, phenol resin, epoxy resin, melamine resin, urea resin, unsaturated polyester resin, alkyd resin, polyurethane, polyimide, polyethylene, polypropylene, polyvinyl chloride, polystyrene, polyvinyl acetate, polytetrafluoroethylene, acrylonitrile butadiene styrene resin, acrylonitrile styrene resin, polyamide, polyacetal, polycarbonate, polyvinyl alcohol, modified polyphenylene ether, polybutylene terephthalate, polyethylene terephthalate, polyphenylene sulfide, polysulfone, polyether ether ketone, polyamideimide, etc.

As the solvent, there can be used any given solvent capable of constituting the processing liquid by dissolving any of the resins. In particular, the solvent which is compatible with the peeling liquid is preferably used.

In the case of any of the resins, as the peeling liquid, there can be used water such as DIW and a water-based peeling liquid such as an alkaline aqueous solution.

As the residue removing liquid, there can be used any given solvent which has the property of dissolving any of the resins. As the residue removing liquid, there can be used, for example, organic solvents such as thinner, toluene, acetates, alcohols and glycols as well as acid solutions such as acetic acid, formic acid and hydroxyl acetic acid. In particular, the solvent which is compatible with a water-based peeling liquid is preferably used.

Figure 7:
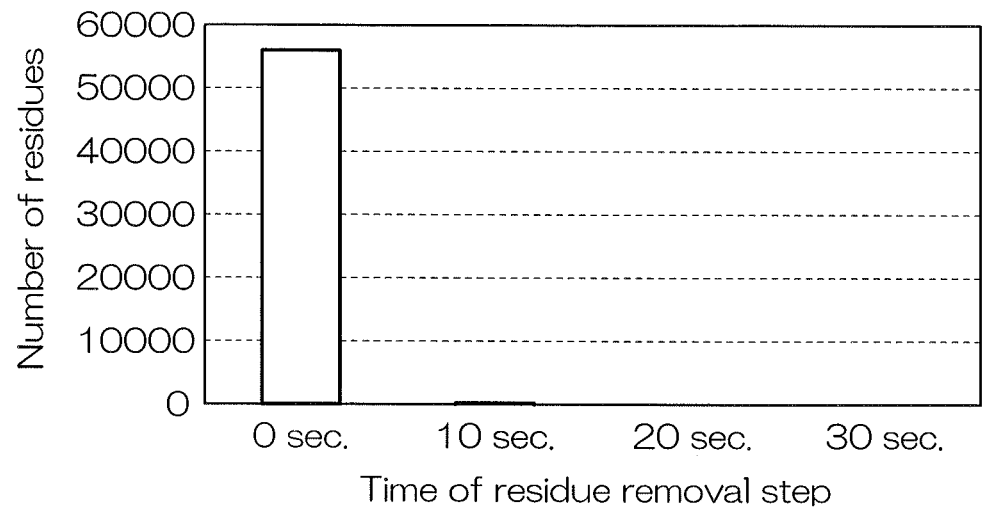
FIG. 7 is a graph which shows a measurement result of the number of residues.

FIG. 7 is a graph which shows measurement results of the number of residues of the particle holding layer that remain on an upper surface of a substrate when the substrate cleaning is executed by attaching $SiO_2$ particles on an Si substrate. The number of residues in each case that the residue removal step among individual steps of the substrate cleaning shown in FIG. 4 is omitted, the residue removal step is executed for 10 seconds, 20 seconds and 30 seconds is shown sequentially from the left side of the drawing.

From the results of FIG. 7, it can be seen that the residue removal step is executed to greatly suppress residues of the particle holding layer from remaining on an upper surface of a substrate W or being attached again thereto.

Figure 8:
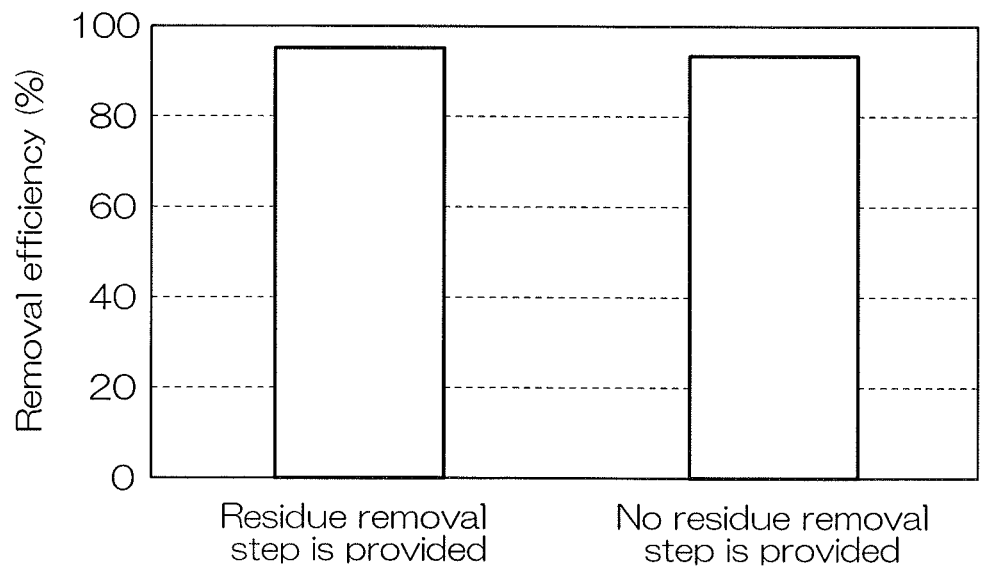
FIG. 8 is a graph which shows a measurement result of particle removal efficiency (PRE).

FIG. 8 is a graph which shows measurement results of particle removal efficiency (PRE) when the substrate cleaning is executed by attaching $SiO_2$ particles on an Si substrate.

At the left side of the above-described drawing, there is shown a PRE of particles having a granular diameter equal to or greater than a predetermined diameter where each step of the substrate cleaning shown in FIG. 4 is executed, in other words, removal of residues is executed. Further, at the right side of the drawing, there is shown a PRE of particles having a granular diameter equal to or greater than the predetermined diameter where the residue removal step is omitted in each step of the substrate cleaning.

In each of the above-described cases, a high PRE is obtained. From these results, it can be seen that particles released again upon execution of the residue removal step are quite small in quantity and also less likely to be attached again on an upper surface of a substrate, thus resulting in no possible reduction in PRE even if the residue removal step is executed.

Second Preferred Embodiment

Figure 9:
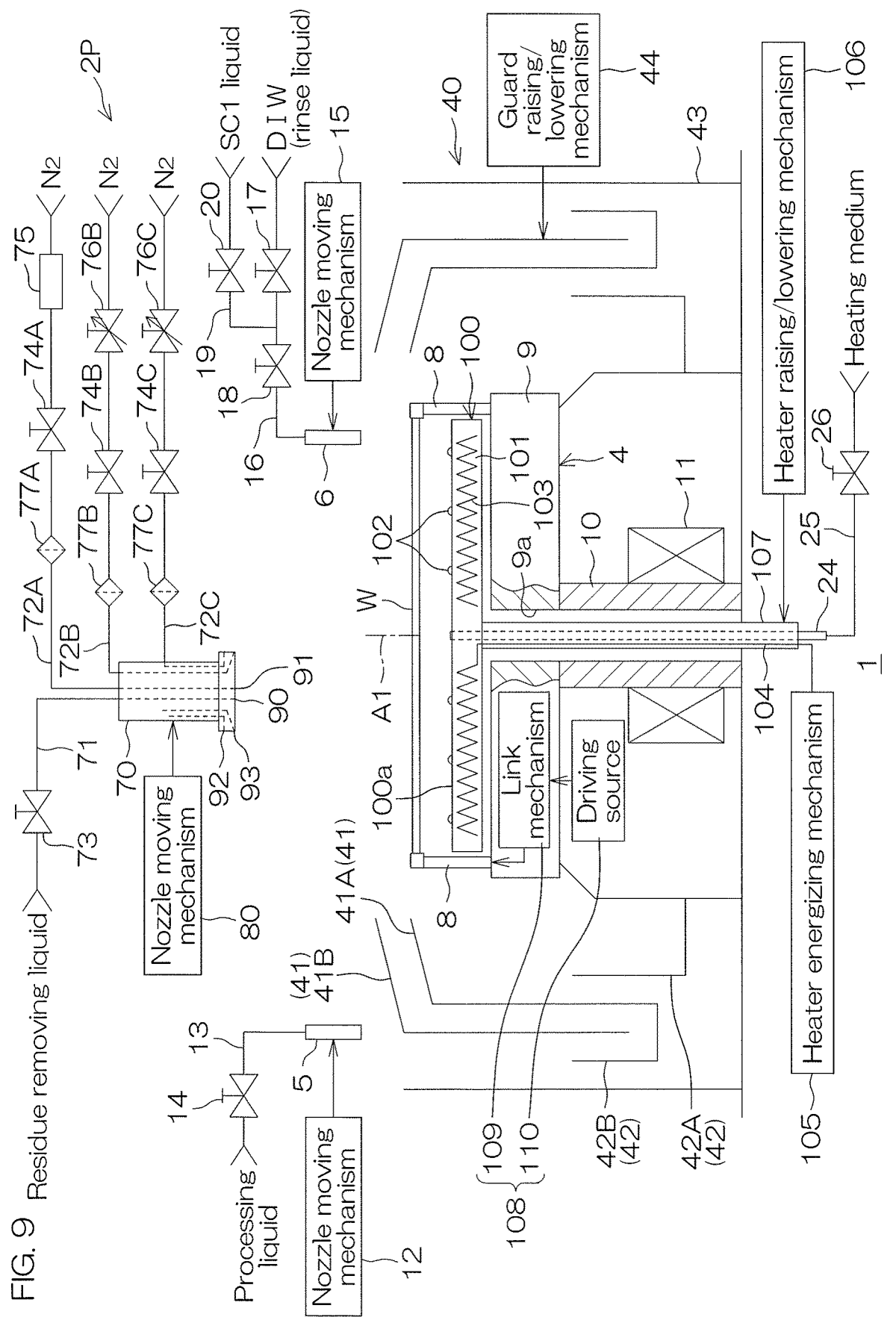

FIG. 9 is a schematic sectional view which shows a brief configuration of a processing unit 2P according to a second preferred embodiment of the present invention. In FIG. 9, members which are the same as those described above are given the same reference numerals, with a description thereof omitted (this is also applicable to FIG. 10 to FIG. 12 which will be described later).

With reference to FIG. 9, the processing unit 2P is different from the processing unit 2 according to the first preferred embodiment (refer to FIG. 2) in that the processing unit 2P according to the second preferred embodiment includes a moving nozzle 70 and a heater unit 100 in place of the facing member 50, the residue removing liquid supplying nozzle 7, the gas supplying nozzle 60 and the rinse liquid supplying nozzle 65.

The moving nozzle 70 is a nozzle capable of moving at least in a horizontal direction. The moving nozzle 70 has functions as a residue removing liquid supplying unit which supplies a residue removing liquid to the upper surface of the substrate W and as a gas supplying unit which supplies a gas such as nitrogen gas to the upper surface of the substrate W.

The moving nozzle 70 is moved by a third nozzle moving mechanism 80, for example, in a horizontal direction (a direction perpendicular to a rotation axis A1). The moving nozzle 70 can be moved by movement in the horizontal direction between a central position and a retracted position. When the moving nozzle 70 is positioned at the central position, the moving nozzle 70 faces a rotation central position of an upper surface of a substrate W. When the moving nozzle 70 is positioned at the retracted position, the moving nozzle 70 does not face the upper surface of the substrate W. The retracted position of not facing the upper surface of the substrate W is a position at the outer side of a spin base 9 in a plan view.

A residue removing liquid supplying pipe 71, a first gas supplying pipe 72A, a second gas supplying pipe 72B and a third gas supplying pipe 72C are connected to the moving nozzle 70. A valve 73, which opens and closes a flow passage in the residue removing liquid supplying pipe 71, is interposed in the residue removing liquid supplying pipe 71. Valves 74A, 74B and 74C which open and close a flow passage thereof are interposed respectively in the gas supplying pipes 72A, 72B and 72C.

The moving nozzle 70 is provided with a central discharge port 90 which discharges the residue removing liquid supplied from the residue removing liquid supplying pipe 71 along the vertical direction. The moving nozzle 70 is provided with a linear flow discharge port 91 which discharges the gas supplied from the first gas supplying pipe 72A linearly along the vertical direction. The moving nozzle 70 is also provided with a horizontal flow discharge port 92 which radially discharges the gas supplied from the second gas supplying pipe 72B along the horizontal direction around the moving nozzle 70. Further, the moving nozzle 70 is provided with an inclined flow discharge port 93 which radially discharges the gas supplied from the third gas supplying pipe 72C along an inclined downward direction around the moving nozzle 70.

A mass flow controller 75 for accurately adjusting a flow rate of the gas which flows inside the first gas supplying pipe 72A is interposed in the first gas supplying pipe 72A. The mass flow controller 75 has a flow-rate control valve. A flow-rate variable valve 76B for adjusting a flow rate of a gas which flows inside the second gas supplying pipe 72B is also interposed in the second gas supplying pipe 72B. Further, a flow-rate variable valve 76C for adjusting a flow rate of a gas which flows inside the third gas supplying pipe 72C is interposed in the third gas supplying pipe 72C. Still further, filters 77A, 77B and 77C for removing foreign matter are interposed respectively in the gas supplying pipes 72A, 72B and 72C.

In the present preferred embodiment, a plurality of chuck pins 8 are able to open and close between a closed state in which the chuck pins grip a substrate W in contact with the peripheral end of the substrate W and an open state in which the chuck pins are retracted from the peripheral end of the substrate W. Further, in the open state, the plurality of chuck pins 8 are separated from the peripheral end of the substrate W to release the gripping, while they are in contact with a lower surface of a peripheral edge portion of the substrate W to support the substrate W from below. The processing unit 2P further includes a chuck pin driving mechanism 108 for driving the plurality of chuck pins 8 so as to be opened and closed. The chuck pin driving mechanism 108 includes, for example, a link mechanism 109 which is housed inside a spin base 9 and a driving source 110 which is disposed outside the spin base 9. The driving source 110 includes, for example, a ball screw mechanism and an electric motor which applies a driving force thereto.

The heater unit 100 has a disk-like hot plate shape. The heater unit 100 is provided with a facing surface 100*a* which faces the lower surface of the substrate W from below.

The heater unit 100 includes a plate main body 101, a plurality of support pins 102 and a heater 103. The plate main body 101 is slightly smaller than a substrate W in a plan view. The plurality of support pins 102 protrude from an upper surface of the plate main body 101. The facing surface 100*a* is configured with the upper surface of the plate main body 101 and front surfaces of the plurality of support pins 102. The heater 103 may be a resistive element housed inside the plate main body 101. The heater 103 is energized to heat the facing surface 100*a*. Then, electricity is supplied to the heater 103 via a feeder 104 from a heater energizing mechanism 105.

The heater unit 100 is disposed above the spin base 9. The processing unit 2P includes a heater raising/lowering mechanism 106 which raises and lowers the heater unit 100 relatively in relation to the spin base 9. The heater raising/lowering mechanism 106 includes, for example, a ball screw mechanism and an electric motor which applies a driving force thereto.

A raising/lowering shaft 107 which extends in a vertical direction along the rotation axis A1 is coupled to a lower surface of the heater unit 100. The raising/lowering shaft 107 is inserted into a penetration hole 9*a* formed at a center portion of the spin base 9 and a hollow rotating shaft 10. The feeder 104 is allowed to pass through the raising/lowering shaft 107.

The heater raising/lowering mechanism 106 raises and lowers the heater unit 100 via the raising/lowering shaft 107, by which the heater unit 100 can be disposed at any given intermediate position between a lower position and an upper position. When the heater unit 100 is positioned at the lower position, a distance between the facing surface 100*a* and the lower surface of the substrate W is, for example, 15 mm. When the heater unit 100 moves from the lower position to the upper position, the facing surface 100*a* is in contact with the lower surface of the substrate W before the heater unit 100 reaches the upper position.

A position of the heater unit 100 when the facing surface 100*a* of the heater unit 100 is in contact with the lower surface of the substrate W is referred to as a contact position. When the plurality of chuck pins 8 are in an open state, the heater unit 100 is able to move further above than the contact position. When the heater unit 100 is positioned further above than the contact position, the substrate W is brought upward by the heater unit 100. When the heater unit 100 is positioned further above than the contact position or at the contact position, it heats the substrate W in a contact state.

When the heater unit 100 is positioned further below than the contact position, it heats the substrate W by radiant heat from the facing surface 100*a*. The substrate W is heated more intensely as the heater unit 100 is closer to the substrate W. The heating medium supplying nozzle 24 of the processing unit 2P is inserted through the hollow raising/lowering shaft 107 and also penetrates through the heater unit 100.

Figure 10:
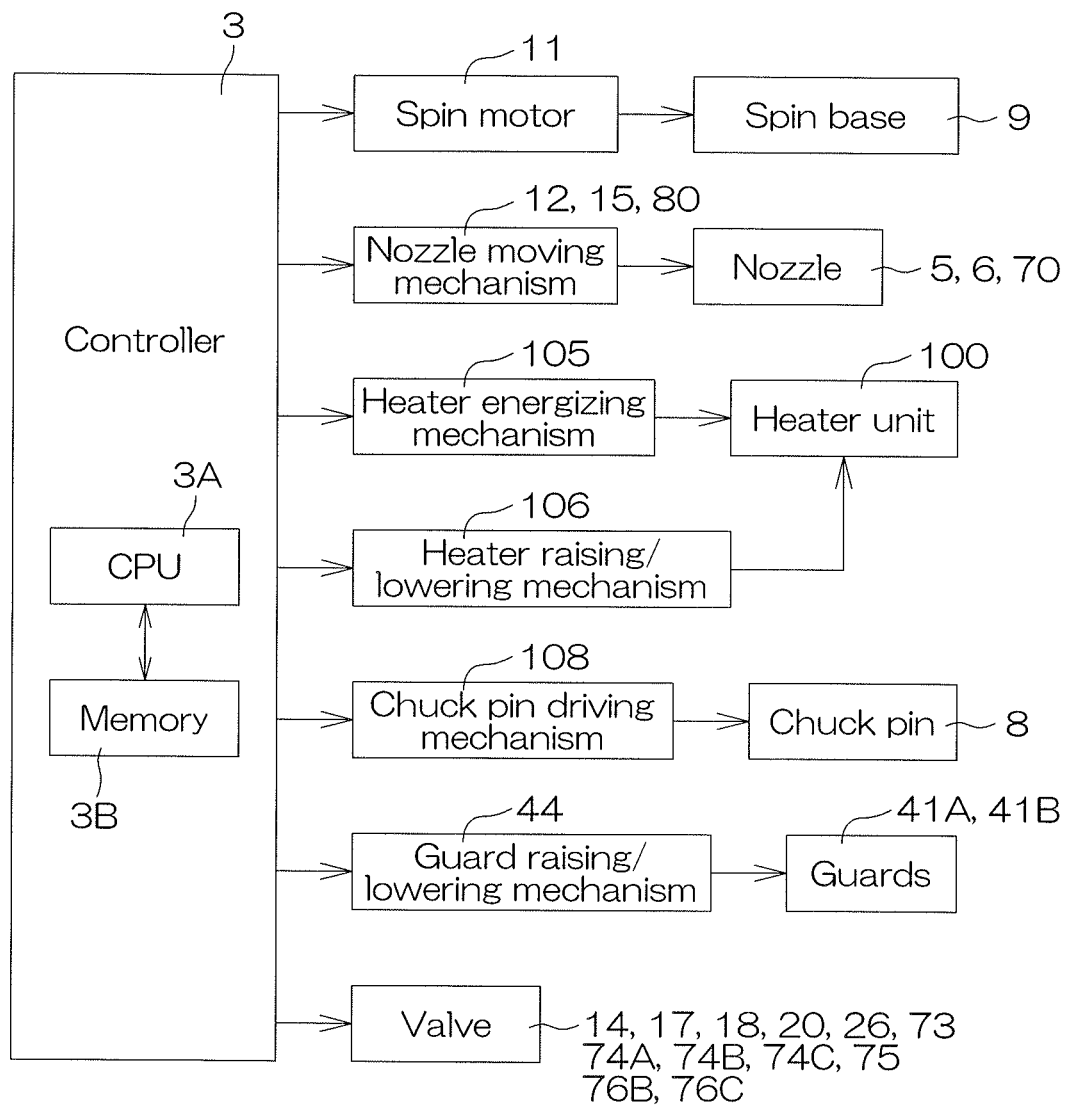
FIG. 10 is a block diagram which shows an electrical configuration of a processing unit according to the second preferred embodiment.

FIG. 10 is a block diagram which shows an electrical configuration of the processing unit 2P according to the second preferred embodiment. A controller 3 of the processing unit 2P according to the second preferred embodiment includes, as with the first preferred embodiment, a processor (CPU) 3A and a memory 3B which houses control programs, and is configured so as to execute various types of control for substrate processing in accordance with the control programs executed by the processor 3A. The controller 3 is programmed so as to control the spin motor 11, the chuck pin driving mechanism 108, the nozzle moving mechanisms 12, 15, 80, the heater energizing mechanism 105, the heater raising/lowering mechanism 106, the guard raising/lowering mechanism 44 and valves, 14, 17, 18, 20, 26, 73, 74A, 74B, 74C, 75, 76B, 76C.

The processing unit 2P according to the second preferred embodiment is able to execute the substrate cleaning similar to that executed by the processing unit 2 according to the first preferred embodiment (refer to FIG. 4). However, behavior of individual members of the processing unit 2P according to the second preferred embodiment with regard to the substrate cleaning is different from behavior of individual members of the processing unit 2 according to the first preferred embodiment. Therefore, a detailed description will be given of the substrate cleaning by the processing unit 2P according to the second preferred embodiment by referring to FIG. 11A to FIG. 11H. FIG. 11A to FIG. 11H are each an illustrative sectional view which describes a mode of one example of the substrate cleaning by the processing unit 2P. At the time of starting the substrate processing, the controller 3 controls the heater raising/lowering mechanism 106 to dispose the heater unit 100 at the lower position.

In the substrate cleaning by the processing unit 2, the processing liquid supplying step is at first executed (Step S1). In the processing liquid supplying step, at first, the controller 3 drives the spin motor 11 to rotate the spin base 9, thereby starting rotation of a substrate W. In the processing liquid supplying step, the spin base 9 is rotated at a predetermined processing liquid supplying speed as a substrate rotating speed. The processing liquid supplying speed is, for example, from 10 rpm to several tens of rpm.

Figure 11A:
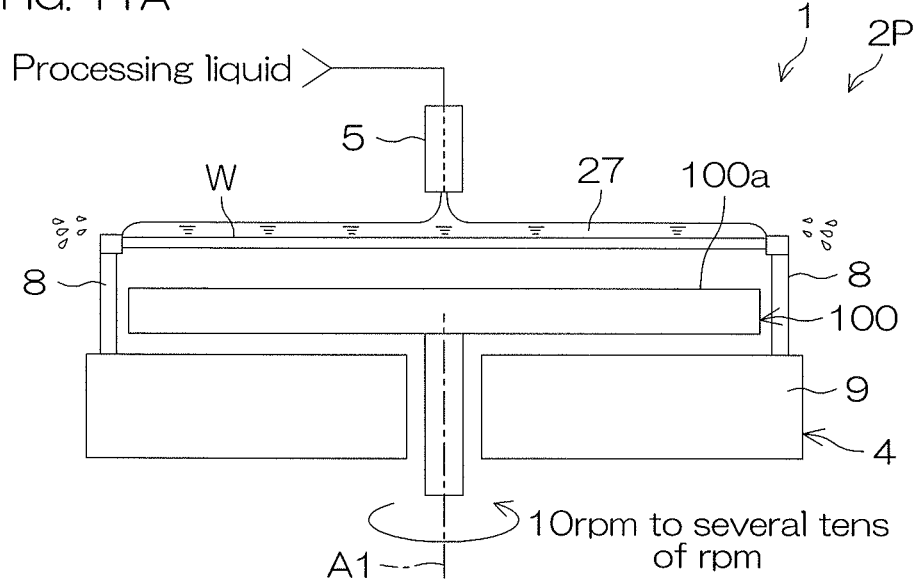
FIG. 11A to FIG. 11H are each an illustrative sectional view which describes a mode of substrate cleaning by the processing unit according to the second preferred embodiment.

Next, the controller 3 controls the first nozzle moving mechanism 12 to dispose the processing liquid supplying nozzle 5 at a central position above a substrate W. Then, the controller 3 opens the valve 14. Thereby, as shown in FIG. 11A, a processing liquid 27 is supplied from the processing liquid supplying nozzle 5 toward the upper surface of the substrate W in the rotation state. The processing liquid 27 supplied to the upper surface of the substrate W spreads across the upper surface of the substrate W substantially in its entirety by actions of a centrifugal force.

After supply of the processing liquid for a fixed time, there is executed a film forming step in which the processing liquid is solidified or hardened to form a particle holding layer on an upper surface of a substrate W (Step S2). In the film forming step, the controller 3 at first closes the valve 14 to stop supply of the processing liquid 27 from the processing liquid supplying nozzle 5. Then, the controller 3 allows the processing liquid supplying nozzle 5 to move to the retracted position.

Figure 11B:
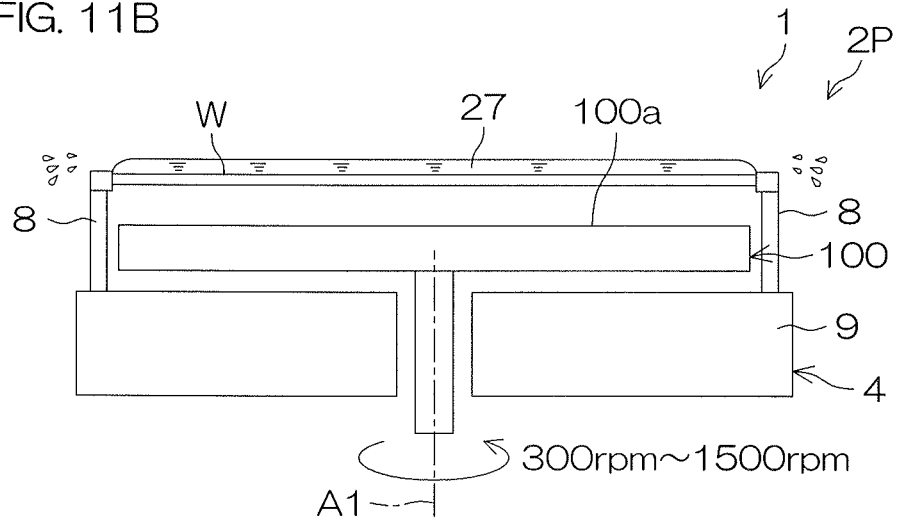

When supply of the processing liquid 27 from the processing liquid supplying nozzle 5 is stopped, the controller 3 controls the spin motor 11, thereby rotating the spin base 9 at a predetermined spin-off speed as a substrate rotating speed (spin off step, Step S2*a*). The spin off speed is, for example, from 300 rpm to 1500 rpm. Thereby, as shown in FIG. 11B, at first, the processing liquid 27 supplied to the upper surface of the substrate W is expelled from a peripheral edge of the upper surface of the substrate W and, next, a volatile solvent proceeds to volatilize.

Figure 11C:
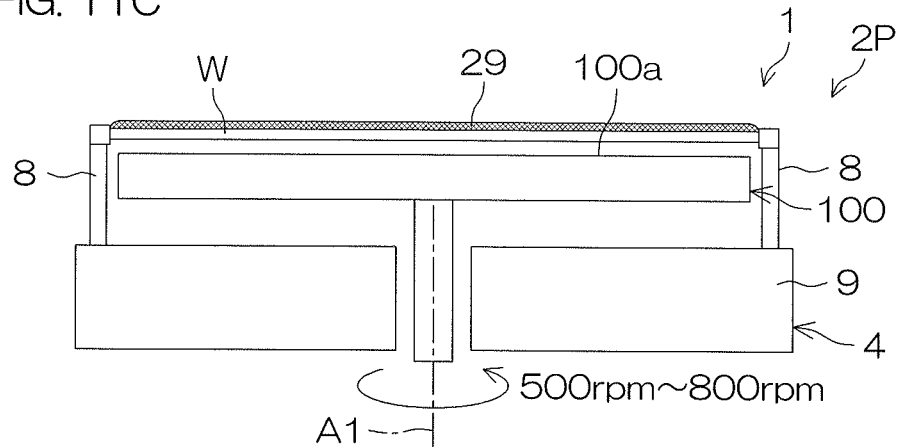

Next, the controller 3 controls the spin motor 11, thereby rotating the spin base 9 at a predetermined speed at the time of heating as a substrate rotating speed. The speed at the time of heating is, for example, from 100 rpm to 1500 rpm. Then, as shown in FIG. 11C, the controller 3 controls the heater raising/lowering mechanism 106 to raise the heater unit 100 from the lower position, thereby disposing the heater unit 100 at a proximity position which is closer to the substrate W than when being positioned at the lower position. Thereby, the substrate W is heated more intensely by the heater unit 100 (heating step, Step S2b). When the heater unit 100 is positioned at the proximity position, the facing surface 100a is separated below only by a predetermined distance from the lower surface of the substrate W (for example, 4 mm).

A change in rotating speed of the substrate W to the speed at the time of heating and movement of the heater unit 100 to the proximity position may be started at the same time.

Then, the volatile solvent further proceeds to volatilize and also the processing liquid 27 is solidified or hardened. Thereby, a solid-state film which is composed of a solute composition, that is, the particle holding layer 29 is formed.

After heating for a fixed time, there is executed a removal step in which the particle holding layer 29 is peeled and removed from an upper surface of a substrate W (Step S3).

In detail, the controller 3 controls the heater raising/lowering mechanism 106, thereby allowing the heater unit 100 to move from the proximity position to the lower position. Then, the controller 3 controls the spin motor 11, thereby rotating the spin base 9 at a predetermined removal speed as a substrate rotating speed. The removal speed is, for example, from 500 rpm to 800 rpm. Further, the controller 3 controls the second nozzle moving mechanism 15, thereby allowing the peeling liquid supplying nozzle 6 to move to the central position above a substrate W.

Figure 11D:
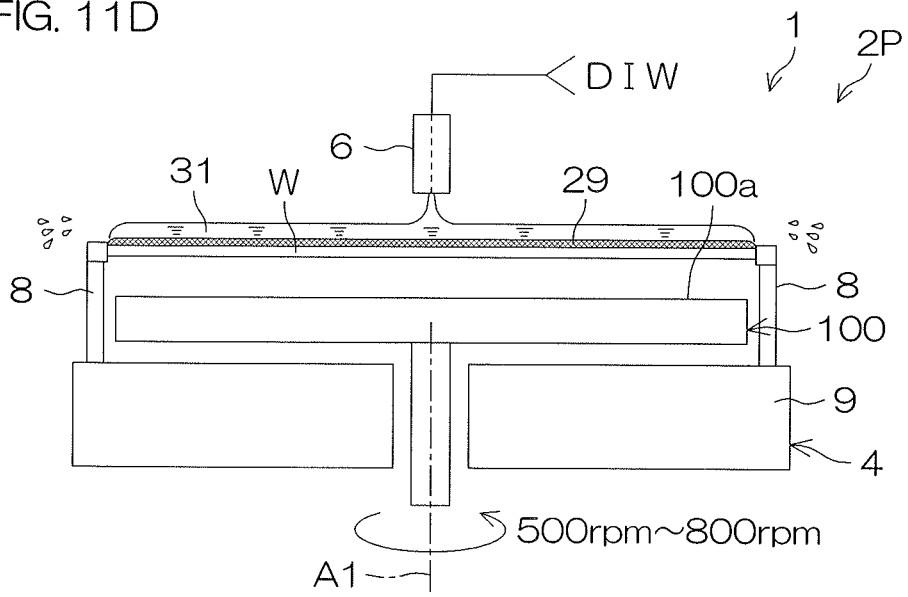

After the peeling liquid supplying nozzle 6 has reached the central position above the substrate W, the controller 3 opens the valves 17, 18, while keeping the valve 20 closed. Thereby, as shown in FIG. 11D, DIW 31 is supplied as a first peeling liquid from the peeling liquid supplying nozzle 6 toward the upper surface of the substrate W in the rotation state (DIW supplying step, Step S3a). The DIW 31 supplied to the upper surface of the substrate W spreads across the upper surface of the substrate W substantially in its entirety by actions of a centrifugal force and is expelled from a peripheral edge of the upper surface of the substrate W.

A change in rotating speed of the substrate W to the removal speed, movement of the peeling liquid supplying nozzle 6 to the central position and movement of the heater unit 100 to the lower position may be started at the same time.

Figure 11E:
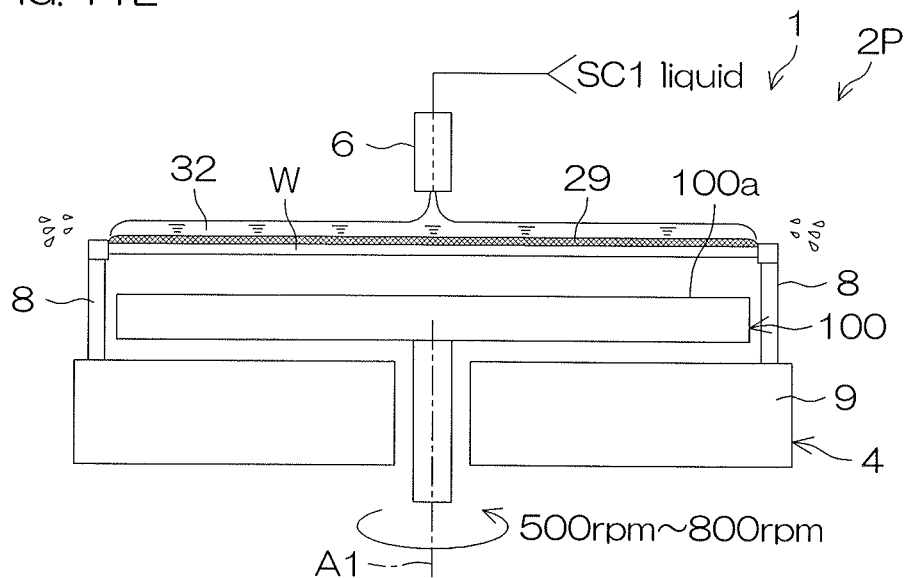

Next, the controller 3 opens the valve 20 after closing the valve 17 to stop supply of DIW, while rotating the spin base 9 while maintaining the substrate rotating speed at the removal speed. Thereby, as shown in FIG. 11E, an SC1 liquid 32 is supplied as one example of the second peeling liquid from the peeling liquid supplying nozzle 6 toward the upper surface of the substrate W in the rotation state (SC1 liquid supplying step, Step S3b). The SC1 liquid 32 supplied to the upper surface of the substrate W spread across the upper surface of the substrate W substantially in its entirety by actions of a centrifugal force, replaces the DIW 31 and is expelled from a peripheral edge of the upper surface of the substrate W.

The particle holding layer 26 peeled from the upper surface of the substrate W is expelled from the peripheral edge of the upper surface of the substrate W together with the peeling liquid by actions of a centrifugal force as a result of rotation of the substrate W. In other words, the particle holding layer 29 peeled from the upper surface of the substrate W is removed.

Figure 11F:
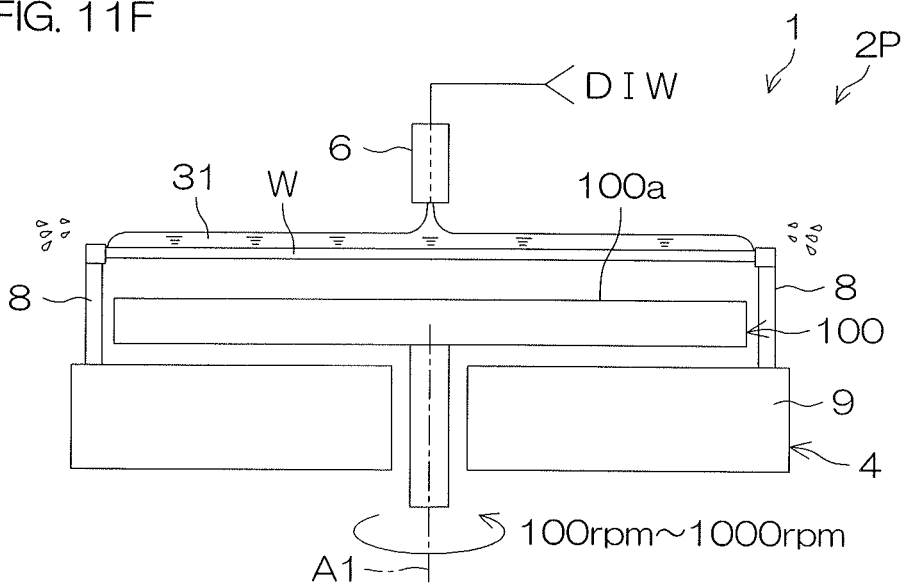

Next, the controller 3 closes the valve 20 to stop supply of the SC1 liquid and, thereafter, controls the spin motor 11, thereby rotating the spin base 9 at a predetermined rinse speed as a substrate rotating speed. The rinse speed is, for example, from 100 rpm to 1000 rpm. Then, the controller 3 opens the valve 17. Thereby, as shown in FIG. 11F, the DIW 31 is supplied as a rinse liquid from the peeling liquid supplying nozzle 6 toward the upper surface of the substrate W in the rotation state (rinse step, Step S4).

The supplied DIW 31 spreads across the upper surface of the substrate W substantially in its entirety by actions of a centrifugal force and is expelled from the peripheral edge of the upper surface of the substrate W. Thereby, the SC1 liquid 32 remaining on the upper surface of the substrate W is washed away from the upper surface of the substrate W. Further, for example, even where the particle holding layer 29, which is peeled from the upper surface of the substrate W in a previous step, remains partially without being removed, the particle holding layer is washed away from the upper surface of the substrate W by the DIW 31.

However, for example, conditions of the earlier DIW 31 supplying step (Step S3a) and the SC1 liquid 32 supplying step (Step S3b) can be also adjusted so as to sufficiently remove the particle holding layer 29 from the upper surface of the substrate W in both of these steps. In this case, the DIW 31 supplying step (Step S4) may be omitted.

Then, there is executed a residue removal step which removes residues that remain on the upper surface of the substrate W after the particle holding layer 29 has been removed (Step S5).

That is, the controller 3 controls the spin motor 11, thereby rotating the spin base 9 at a predetermined residue removing speed as a substrate rotating speed. The residue removing speed is, for example, from several tens of rpm to 300 rpm.

Next, the controller 3 controls the heater raising/lowering mechanism 106, thereby allowing the heater unit 100 to move from the lower position to the proximity position. The controller 3 closes the valves 17, 18 to stop supply of DIW from the peeling liquid supplying nozzle 6. Then, the controller 3 controls the second nozzle moving mechanism 15, thereby allowing the peeling liquid supplying nozzle 6 to move to the retracted position.

A change in rotating speed of the substrate W to the removal speed, movement of the peeling liquid supplying nozzle 6 to the retracted position and movement of the heater unit 100 to the proximity position are started at the same time, for example.

Figure 11G:
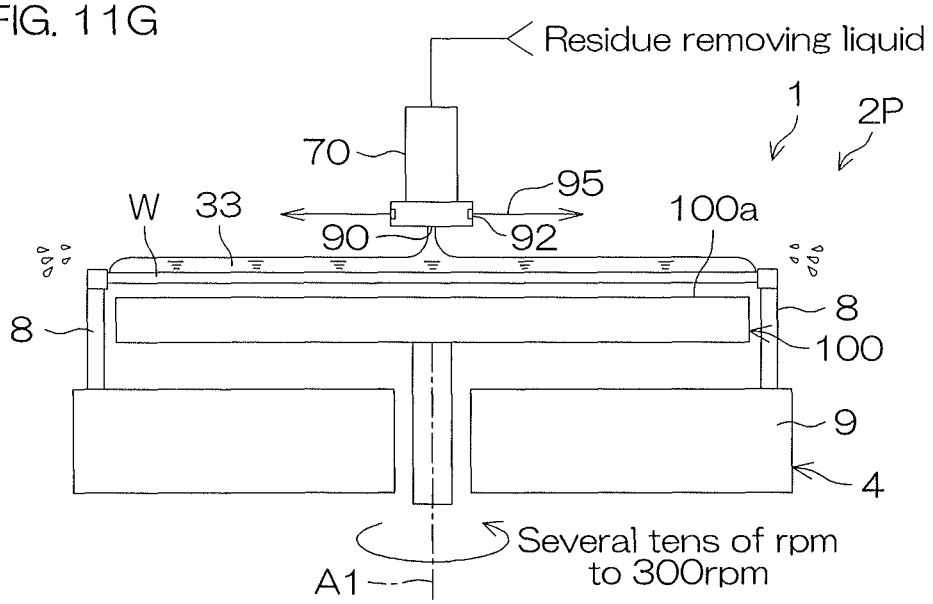

Next, the controller 3 controls the third nozzle moving mechanism 80 to dispose the moving nozzle 70 at the central position above the substrate W. The controller 3 opens the valve 73 after the moving nozzle 70 has reached the central position. Thereby, as shown in FIG. 11G, a residue removing liquid 33 is supplied from the moving nozzle 70 toward the upper surface of the substrate W in the rotation state.

The residue removing liquid 33 supplied to the upper surface of the substrate W spreads across the upper surface of the substrate W substantially in its entirety by actions of a centrifugal force and replaces the DIW 31. Then, the residue removing liquid 33 supplied to the upper surface of the substrate W dissolves residues of the particle holding layer 29 that remain on the upper surface of the substrate W and, thereafter is expelled from a peripheral edge of the upper surface of the substrate W.

Further, the controller 3 opens the valve 74B. Thereby, the gas such as nitrogen gas is radially discharged from the horizontal flow discharge port 92 of the moving nozzle 70 to cover the upper surface of the substrate W with a horizontal gas flow 95. A flow rate of nitrogen gas which is discharged from the horizontal flow discharge port 92 is 100 liters per minute, for example. Since the upper surface of the substrate W is covered with the horizontal gas flow of nitrogen gas, it is possible to suppress or prevent droplets splashed around from individual member inside the processing unit 2P or mist in the atmosphere from being attached to the upper surface of the substrate W.

Next, the controller 3 closes the valve 73 to stop supply of the residue removing liquid 33 from the moving nozzle 70. Thereafter, the controller 3 controls the third nozzle moving mechanism 80 to bring the moving nozzle 70 close to the upper surface of the substrate W. In this state, the controller 3 opens the valve 74A to spray perpendicularly a linear gas flow 96 of gas, for example, in a quantity of 15 liters per minute toward a central portion of the substrate W from the linear flow discharge port 91. Further, the controller 3 controls the heater raising/lowering mechanism 106, thereby allowing the heater unit 100 to move from the proximity position to the lower position. Then, the controller 3 controls the spin motor 11, thereby rotating the spin base 9 at a predetermined spin dry speed as a substrate rotating speed (Step S6). The spin dry speed is, for example, 800 rpm.

Figure 11H:
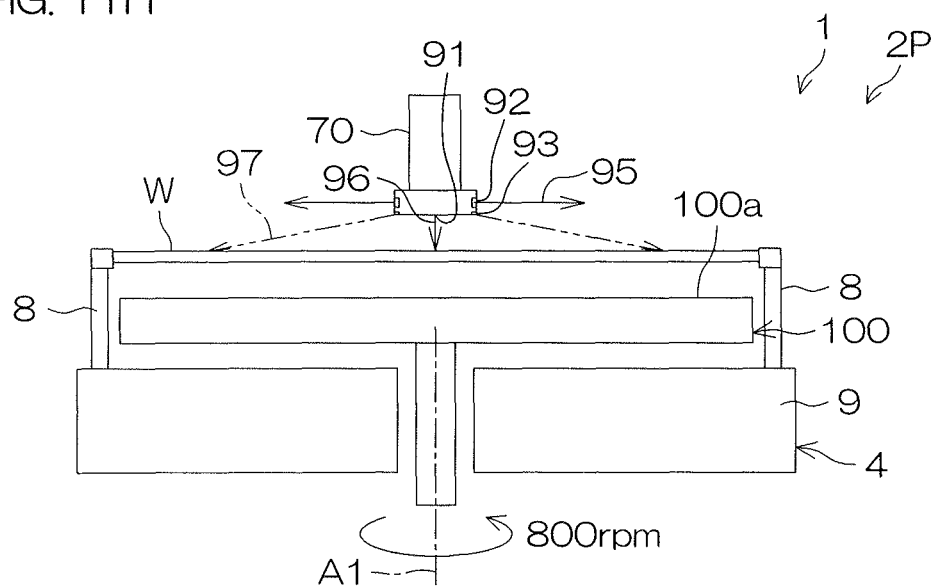

By rotation of the substrate W, a centrifugal force is applied to the residue removing liquid 33. And, as shown in FIG. 11H, the residue removing liquid 33 is expelled from the peripheral edge of the upper surface of the substrate W and also removed by being volatilized from the upper surface of the substrate W. Spin dry is executed to complete a series of cleaning steps.

When the residue removing liquid 33 is removed from the substrate W, as shown by a double dotted & dashed line in FIG. 11H, the controller 3 may open the valve 74C to discharge a gas from the inclined flow discharge port 93. An inclined gas flow 97 formed by the gas discharged from the inclined flow discharge port 93 collides against the upper surface of the substrate W and changes its direction to the outer side parallel to the upper surface of the substrate W.

Thereafter, the controller 3 closes the valves 74A, 74B to stop supply of the gas from the moving nozzle 70.

Figure 12A:
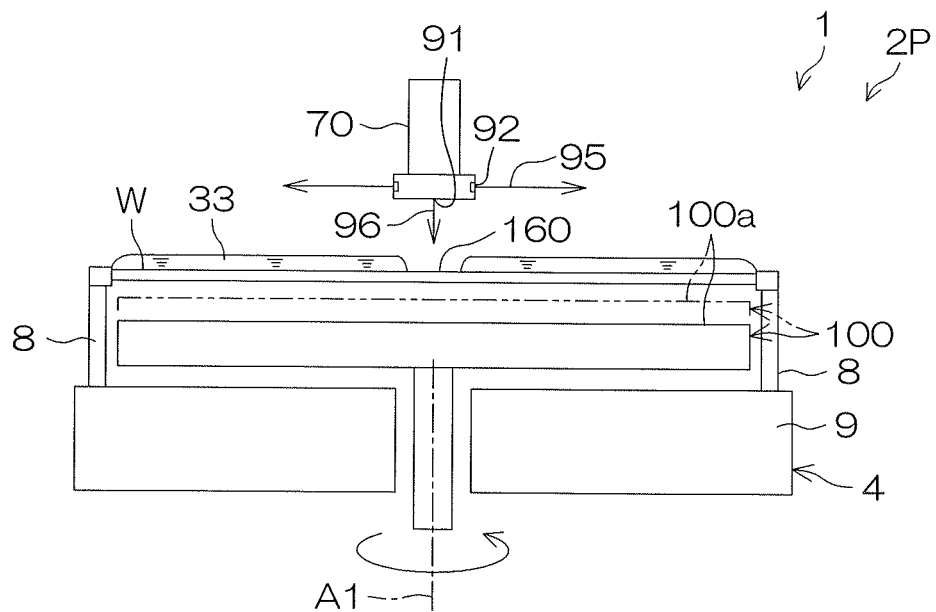
FIG. 12A and FIG. 12B are each an illustrative sectional view which describes another example of the substrate cleaning by the processing unit according to the second preferred embodiment.
Figure 12B:
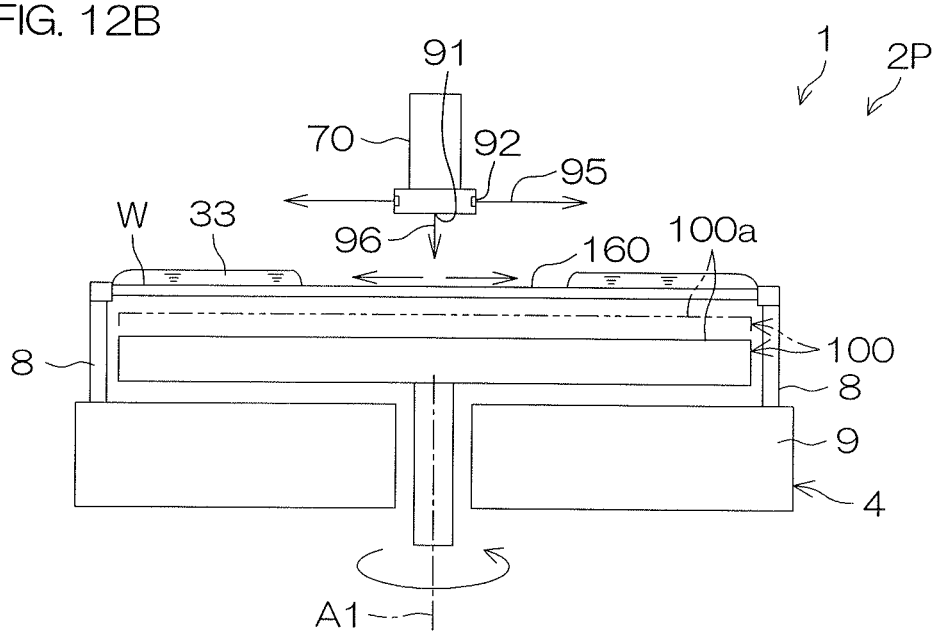

After the residue removal step and also before the spin dry step, as shown in FIG. 12A and FIG. 12B, when the residue removing liquid 33 is removed from the substrate W, a hole 160 may be formed at a central region of a liquid film of the residue removing liquid 33 to remove the residue removing liquid 33 from the substrate W so as to widen the hole 160.

In detail, with reference to FIG. 12A, the linear gas flow 96 is sprayed perpendicularly from the linear flow discharge port 91 toward a central portion of the substrate W, thereby forming the hole 160 at the central region of the liquid film of the residue removing liquid 33 (hole opening step). With reference to FIG. 12B, the linear gas flow 96 collides against the upper surface of the substrate W and changes its direction to the outer side parallel to the upper surface of the substrate W. Therefore, the hole 160 is widened toward an outer periphery of the substrate W at least by one of a spraying force as a result of the linear gas flow 96 and a centrifugal force by rotation of the substrate W (hole widening step). The liquid film of the residue removing liquid 33 is moved, by which the residue removing liquid 33 is removed outside the substrate W. In the hole opening step and the hole widening step, the heater unit 100 may be positioned at the lower position (a position shown by a solid line in FIG. 12A and FIG. 12B) or may be positioned at the proximity position (a position shown by a double dotted & dashed line in FIG. 12A and FIG. 12B).

A description has been so far given of the preferred embodiments of the present invention, and the present invention may be carried out in yet other modes.

In order to heat the processing liquid, for example, heat from a heat source such as a lamp and an electric heater may be used in place of supplying the heating medium 28 to the rear surface of the substrate W. The substrate W may be heated inside a special chamber. Further, individual steps of forming and peeling the particle holding layer 29 as well as removing residues may be executed inside chambers which are different from each other.

The processing liquid, the peeling liquid and the residue removing liquid may be supplied approximately at the same time to an upper surface of a substrate W substantially in its entirety, for example, from a plurality of nozzle holes arranged in a line.

With regard to individual steps of the cleaning method by the substrate cleaning apparatus 1, other steps may be added to the steps described in the preferred embodiments.

As the solute, in addition to various types of resins described previously, for example, organic compounds other than resins and other mixtures with organic compounds may be used. Alternatively, compounds other than organic compounds may be used as the solute.

As the peeling liquid, the other peeling liquid which is not a water-based peeling liquid may be used. In this case, a solute that forms the particle holding layer 29 which is hardly soluble or insoluble in the peeling liquid concerned, a solvent which is compatible with the peeling liquid and dissolves the solute, and a residue removing liquid which is compatible with the peeling liquid and dissolves the solute, etc., may be appropriately combined.

While preferred embodiments of the present invention have been described in detail, it should be understood that these embodiments are merely illustrative of the technical principles of the present invention but not limitative of the invention. The scope of the present invention is to be limited only by appended claims.

The present application corresponds to Japanese Patent Application No. 2017-182550 filed on Sep. 22, 2017 in the Japan Patent Office and Japanese Patent Application No. 2017-232847 filed on Dec. 4, 2017 in the Japan Patent Office, and the entire disclosure of these applications are incorporated herein by reference.

What is claimed is:

1. A substrate cleaning method comprising:
   a processing liquid supplying step of supplying a processing liquid that includes a solute composition and a solvent to an upper surface of a substrate, the solute composition being such that the solute composition is hardly soluble or insoluble in a water-based peeling liquid before being heated to a temperature equal to or higher than a decomposing temperature and that the solute composition is decomposed by being heated to the temperature equal to or higher than the decomposing temperature and becoming soluble in the water-based peeling liquid;
   a film forming step in which the solvent is volatilized from the processing liquid present on the upper surface of the substrate, thereby solidifying or hardening the processing liquid to form a particle holding layer, in the form of a solid-state film made of the solute composition, on the upper surface of the substrate, the film forming step including a heating step of heating the processing liquid supplied to the upper surface of the substrate to a temperature lower than the decomposing temperature;

a rotating step of rotating the substrate;

a removal step of supplying the water-based peeling liquid to the upper surface of the substrate while rotating the substrate by the rotating step so as to peel the particle holding layer off the upper surface of the substrate and remove the particle holding layer from the upper surface of the substrate, wherein the particle holding layer is excluded from a periphery of the upper surface of the substrate together with the water-based peeling liquid by an action of centrifugal force due to the rotation of the substrate;

a residue removal step of supplying a residue removing liquid, which dissolves the solute composition, to the upper surface of the substrate after the removal step; and a rinse step of supplying a rinse liquid to wash away the water-based peeling liquid from the upper surface of the substrate before the residue removal step and after the removal step, wherein the processing liquid supplying step includes a step of supplying the processing liquid to the upper surface of the substrate from a processing liquid nozzle which is positioned in a space between the upper surface of the substrate and a facing surface of a facing member positioned at a first position, the processing liquid nozzle is retracted from the space between the upper surface of the substrate and the facing surface after the processing liquid supplying step, in the heating step, a heating medium having a boiling point lower than the decomposing temperature is supplied to a rear surface that is a lower surface of the substrate, thereby heating the processing liquid supplied to the upper surface of the substrate to the temperature lower than the decomposing temperature, and during the heating step, the facing member is located at a second position which is closer to the upper surface of the substrate than the first position, after retracting the processing liquid nozzle from the space between the upper surface of the substrate and the facing surface.

2. The substrate cleaning method according to claim 1, wherein the temperature of the processing liquid on the substrate heated in the heating step is lower than a boiling point of the solvent.

3. The substrate cleaning method according to claim 1, wherein the water-based peeling liquid includes at least one of deionized water, carbonated water, electrolyzed ion water, hydrogen water, ozone water and hydrochloric acid, ammonia water and hydrogen peroxide aqueous solution, ammonia solution, tetramethylammonium hydroxide solution and chlorine aqueous solution.

4. The substrate cleaning method according to claim 1, wherein the residue removing liquid consists of an organic solvent including at least one selected from thinner, toluene, acetates, alcohols and glycols.

5. The substrate cleaning method according to claim 1, wherein the removal step includes a step of supplying the water-based peeling liquid from a peeling liquid nozzle which is positioned in the space between the upper surface of the substrate and the facing surface of the facing member positioned at the first position.

6. The substrate cleaning method according to claim 5, wherein the peeling liquid nozzle is retracted from the space between the upper surface of the substrate and the facing surface after the removal step, and the rinse step includes a step of supplying the rinse liquid from the facing member in a state where the facing member is positioned at a processing position which is between the first position and the second position, after retracting the peeling liquid nozzle from the space between the upper surface of the substrate and the facing surface.

7. The substrate cleaning method according to claim 6, wherein the residue removal step includes a step of supplying the residue removing liquid from the facing member to the upper surface of the substrate while keeping the facing member positioned at the processing position subsequent to the rinse step.

\* \* \* \* \*